United States Patent
Oliver et al.

(10) Patent No.: US 10,658,424 B2
(45) Date of Patent: May 19, 2020

(54) SUPERCONDUCTING INTEGRATED CIRCUIT

(71) Applicant: Massachusetts Institute of Technology, Cambridge, MA (US)

(72) Inventors: William D. Oliver, Arlington, MA (US); Rabindra N. Das, Lexington, MA (US); David J. Hover, Somerville, MA (US); Danna Rosenberg, Arlington, MA (US); Xhovalin Miloshi, Needham, MA (US); Vladimir Bolkhovsky, Framingham, MA (US); Jonilyn L. Yoder, Billerica, MA (US); Corey W. Stull, Leominster, MA (US); Mark A. Gouker, Belmont, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 78 days.

(21) Appl. No.: 15/745,914

(22) PCT Filed: Jul. 21, 2016

(86) PCT No.: PCT/US2016/043266
§ 371 (c)(1),
(2) Date: Jan. 18, 2018

(87) PCT Pub. No.: WO2017/015432
PCT Pub. Date: Jan. 26, 2017

(65) Prior Publication Data
US 2018/0247974 A1    Aug. 30, 2018

Related U.S. Application Data

(60) Provisional application No. 62/195,852, filed on Jul. 23, 2015.

(51) Int. Cl.
*H01L 27/18* (2006.01)
*G06N 10/00* (2019.01)
(Continued)

(52) U.S. Cl.
CPC ............. *H01L 27/18* (2013.01); *G06N 10/00* (2019.01); *H01L 39/045* (2013.01);
(Continued)

(58) Field of Classification Search
CPC .......... H01L 27/18; G06N 10/00; H01P 7/086
See application file for complete search history.

(56) References Cited

U.S. PATENT DOCUMENTS 4,316,200 A    2/1982 Ames et al.
4,612,083 A    9/1986 Yasumoto et al.
(Continued)

OTHER PUBLICATIONS

Ohya et al. "Room temperature deposition of sputtered TiN films for superconducting coplanar waveguide resonators." 2014. Retrieved on Aug. 19, 2019 from https://iopscience.iop.org/article/10.1088/0953-2048/27/1/015009/pdf. (Year: 2014).*
(Continued)

*Primary Examiner* — Jay C Chang
*Assistant Examiner* — Mikka Liu
(74) *Attorney, Agent, or Firm* — Daly Crowley Mofford & Durkee

(57) ABSTRACT

A superconducting integrated circuit includes at least one superconducting resonator, including a substrate, a conductive layer disposed over a surface of the substrate with the conductive layer including at least one conductive material including a substantially low stress polycrystalline Titanium Nitride (TiN) material having an internal stress less than about two hundred fifty MPa (magnitude) such that the at least one superconducting resonator and/or qubit (hereafter
(Continued)

called "device") is provided as a substantially high quality factor, low loss superconducting device.

14 Claims, 15 Drawing Sheets

(51) Int. Cl.
    *H01L 39/22*     (2006.01)
    *H01L 39/24*     (2006.01)
    *H01P 7/08*     (2006.01)
    *H01L 39/04*     (2006.01)

(52) U.S. Cl.
    CPC ........ *H01L 39/223* (2013.01); *H01L 39/2416* (2013.01); *H01L 39/2493* (2013.01); *H01P 7/086* (2013.01)

(56) References Cited

U.S. PATENT DOCUMENTS

| | | | |
|---|---|---|---|
| 5,057,877 | A | 10/1991 | Briley et al. |
| 5,156,997 | A | 10/1992 | Kumar et al. |
| 5,179,070 | A | 1/1993 | Harada et al. |
| 5,371,328 | A | 12/1994 | Gutierrez et al. |
| 5,650,353 | A | 7/1997 | Yoshizawa et al. |
| 5,773,875 | A | 6/1998 | Chan |
| 6,108,214 | A | 8/2000 | Fuse |
| 6,297,551 | B1 | 10/2001 | Dudderar et al. |
| 6,324,755 | B1 | 12/2001 | Borkowski et al. |
| 6,346,469 | B1 | 2/2002 | Greer |
| 6,355,501 | B1 | 3/2002 | Fung et al. |
| 6,375,875 | B1* | 4/2002 | Paulauskas ............ B29C 48/05 264/29.2 |
| 6,396,371 | B2 | 5/2002 | Streeter et al. |
| 6,436,740 | B1 | 8/2002 | Jen et al. |
| 6,485,565 | B1* | 11/2002 | Springer ................ C30B 23/02 117/201 |
| 6,678,167 | B1 | 1/2004 | Degani et al. |
| 6,819,000 | B2 | 11/2004 | Magerlein et al. |
| 6,825,534 | B2 | 11/2004 | Chen et al. |
| 6,838,774 | B2 | 1/2005 | Patti |
| 7,427,803 | B2 | 9/2008 | Chao et al. |
| 7,589,390 | B2 | 9/2009 | Yao |
| 7,624,088 | B2 | 11/2009 | Johnson et al. |
| 7,932,515 | B2 | 4/2011 | Bunyk |
| 7,939,926 | B2 | 5/2011 | Kaskoun et al. |
| 7,993,971 | B2 | 8/2011 | Chatterjee et al. |
| 8,159,825 | B1 | 4/2012 | Dotsenko |
| 8,202,785 | B2 | 6/2012 | Castex et al. |
| 8,354,746 | B2 | 1/2013 | Huang et al. |
| 8,466,036 | B2 | 6/2013 | Brindle et al. |
| 8,487,444 | B2 | 7/2013 | Law et al. |
| 8,492,911 | B2 | 7/2013 | Bachman et al. |
| 8,519,543 | B1 | 8/2013 | Song et al. |
| 8,546,188 | B2 | 10/2013 | Liu et al. |
| 8,564,955 | B2 | 10/2013 | Schmidt et al. |
| 8,736,068 | B2 | 5/2014 | Bartley et al. |
| 8,754,321 | B2 | 6/2014 | Schroeder et al. |
| 8,828,860 | B2 | 9/2014 | Gruber et al. |
| 8,928,128 | B2 | 1/2015 | Karikalan et al. |
| 8,954,125 | B2 | 2/2015 | Gonzalez et al. |
| 9,076,658 | B1 | 7/2015 | Brown et al. |
| 9,171,792 | B2 | 10/2015 | Sun et al. |
| 9,836,699 | B1 | 12/2017 | Rigetti et al. |
| 10,381,541 | B2 | 8/2019 | Das et al. |
| 2001/0016383 | A1 | 8/2001 | Chen et al. |
| 2002/0094661 | A1 | 7/2002 | Enquist et al. |
| 2003/0067073 | A1 | 4/2003 | Akram et al. |
| 2004/0124538 | A1 | 7/2004 | Reif et al. |
| 2004/0188845 | A1 | 9/2004 | Iguchi et al. |
| 2004/0223380 | A1 | 11/2004 | Hato |
| 2006/0191640 | A1 | 8/2006 | Johnson |
| 2007/0087544 | A1 | 4/2007 | Chang et al. |
| 2007/0119812 | A1 | 5/2007 | Kerdiles et al. |
| 2007/0207592 | A1 | 9/2007 | Lu et al. |
| 2008/0093747 | A1 | 4/2008 | Enquist et al. |
| 2008/0122115 | A1 | 5/2008 | Popa et al. |
| 2008/0169559 | A1 | 7/2008 | Yang |
| 2008/0230916 | A1 | 9/2008 | Saito et al. |
| 2008/0290790 | A1 | 11/2008 | Jin |
| 2008/0316714 | A1 | 12/2008 | Eichelberger et al. |
| 2009/0078966 | A1 | 3/2009 | Asai et al. |
| 2009/0173936 | A1* | 7/2009 | Bunyk ................... B82Y 10/00 257/31 |
| 2009/0186446 | A1 | 7/2009 | Kwon et al. |
| 2009/0233436 | A1 | 9/2009 | Kim et al. |
| 2010/0001399 | A1 | 1/2010 | Topacio |
| 2010/0026447 | A1 | 2/2010 | Keefe et al. |
| 2010/0122762 | A1 | 5/2010 | George |
| 2010/0130016 | A1 | 5/2010 | DeVilliers |
| 2010/0148371 | A1 | 6/2010 | Kaskoun et al. |
| 2010/0171093 | A1 | 7/2010 | Kabir |
| 2011/0049675 | A1 | 3/2011 | Nagai et al. |
| 2011/0089561 | A1 | 4/2011 | Kurita et al. |
| 2011/0140271 | A1 | 6/2011 | Daubenspeck et al. |
| 2011/0189820 | A1 | 8/2011 | Sasaki et al. |
| 2011/0204505 | A1 | 8/2011 | Pagaila et al. |
| 2011/0237069 | A1 | 9/2011 | Miyazaki |
| 2011/0248396 | A1 | 10/2011 | Liu et al. |
| 2012/0032340 | A1 | 2/2012 | Choi et al. |
| 2012/0074585 | A1 | 3/2012 | Koo et al. |
| 2012/0217642 | A1 | 8/2012 | Sun et al. |
| 2012/0228011 | A1 | 9/2012 | Chang et al. |
| 2012/0231621 | A1 | 9/2012 | Chang et al. |
| 2012/0252189 | A1 | 10/2012 | Sadaka et al. |
| 2012/0292602 | A1 | 11/2012 | Guo et al. |
| 2013/0029848 | A1* | 1/2013 | Gonzalez ................ H01L 39/14 505/210 |
| 2013/0093104 | A1 | 4/2013 | Wu et al. |
| 2013/0099235 | A1 | 4/2013 | Han |
| 2013/0147036 | A1 | 6/2013 | Choi et al. |
| 2013/0153888 | A1 | 6/2013 | Inoue et al. |
| 2013/0187265 | A1 | 7/2013 | Shih et al. |
| 2013/0244417 | A1 | 9/2013 | Markunas et al. |
| 2014/0001604 | A1 | 1/2014 | Sadaka |
| 2014/0065771 | A1 | 3/2014 | Gruber et al. |
| 2014/0113828 | A1 | 4/2014 | Gilbert et al. |
| 2014/0246763 | A1* | 9/2014 | Bunyk ..................... H01L 27/18 257/663 |
| 2014/0264890 | A1 | 9/2014 | Breuer et al. |
| 2015/0041977 | A1 | 2/2015 | Daubenspeck et al. |
| 2015/0054151 | A1 | 2/2015 | Choi et al. |
| 2015/0054167 | A1 | 2/2015 | Pendse |
| 2015/0054175 | A1 | 2/2015 | Meinhold et al. |
| 2015/0187840 | A1 | 7/2015 | Ladizinsky et al. |
| 2015/0348874 | A1 | 12/2015 | Tsai et al. |
| 2016/0364653 | A1 | 12/2016 | Chow et al. |
| 2017/0040296 | A1 | 2/2017 | Das et al. |
| 2017/0092621 | A1 | 3/2017 | Das et al. |
| 2017/0098627 | A1 | 4/2017 | Das et al. |
| 2017/0125383 | A1 | 5/2017 | Liu |
| 2017/0133336 | A1 | 5/2017 | Oliver et al. |
| 2017/0162507 | A1 | 6/2017 | Das et al. |
| 2017/0162550 | A1 | 6/2017 | Das et al. |
| 2017/0194248 | A1 | 7/2017 | Das |
| 2017/0200700 | A1 | 7/2017 | Das et al. |

OTHER PUBLICATIONS

Ohya et al. "Room temperature deposition of sputtered TiN films for superconducting coplanar waveguide resonators." Published Dec. 5, 2013. (Year: 2013).*
Notice of Allowance dated Jul. 29, 2019 for U.S. Appl. No. 15/327,239, filed Jan. 18, 2017; 14 pages.
Office Action dated Jan. 8, 2019 for U.S. Appl. No. 15/684,269; 23 pages.
Appeal Brief filed on Mar. 28, 2019 for U.S. Appl. No. 15/327,239; 41 pages.
U.S. Appl. No. 15/342,478, filed Nov. 3, 2016, Oliver et al.
U.S. Appl. No. 15/342,517, filed Nov. 3, 2016, Oliver et al.
U.S. Appl. No. 15/342,589, filed Nov. 3, 2016, Oliver et al.

(56) References Cited

OTHER PUBLICATIONS

U.S. Appl. No. 15/684,269, filed Aug. 23, 2017, Das, et al.
U.S. Appl. No. 15/684,337, filed Aug. 23, 2017, Das, et al.
U.S. Appl. No. 15/684,393, filed Aug. 23, 2017, Das, et al.
PCT Search Report of the ISA for PCT Appl. No. PCT/US2015/044608 dated Dec. 31, 2015; 5 pages.
PCT Written Opinion of the ISA for PCT Appl. No. PCT/US2015/044608 dated Dec. 31, 2015; 7 pages.
International Preliminary Report dated Feb. 23, 2017 for PCT Application No. PCT/US2015/044608; 9 pages.
Notice of Allowance for U.S. Appl. No. 15/327,235 dated Jun. 30, 2017; 17 pages.
PCT Search Report of the ISA for PCT Appl. No. PCT/US2015/044679 dated Apr. 13, 2016; 3 pages.
PCT Written Opinion of the ISA for PCT Appl. No. PCT/US2015/044679 dated Apr. 13, 2016; 7 pages.
International Preliminary Report dated Feb. 23, 2017 for PCT Application No. PCT/US2015/044679; 9 pages.
U.S. Non-Final Office Action dated Jan. 11, 218 for U.S. Appl. No. 15/327,239; 33 pages.
Restriction Requirement dated May 16, 2017 for U.S. Appl. No. 15/327,249; 6 pages.
Response to Restriction Requirement dated May 16, 2017 for U.S. Appl. No. 15/327,249, filed Jun. 27, 2017; 1 page.
U.S. Non-Final Office Action dated Oct. 20, 2017 for U.S. Appl. No. 15/327,249; 30 pages.
PCT Search Report of the ISA for PCT Appl. No. PCT/US2015/044651 dated Nov. 4, 2015; 3 pages.
PCT Written Opinion of the ISA for PCT Appl. No. PCT/US2015/044651 dated Nov. 4, 2015; 12 pages.
International Preliminary Report dated Feb. 23, 2017 for PCT Application No. PCT/US2015/044651; 10 pages.
Restriction Requirement dated Jun. 8, 2017 for U.S. Appl. No. 15/271,75; 6 pages.
Response to Restriction Requirement dated Jun. 8, 2017 for U.S. Appl. No. 15/271,755, filed Jun. 19, 2017; 1 page.
U.S. Non-Final Office Action dated Jul. 7, 2017 for U.S. Appl. No. 15/271,755; 26 pages.
Response to Jul. 7, 2017 Office Action for U.S. Appl. No. 15/271,755, filed Oct. 10, 2017; 33 pages.
Final Office Action dated Dec. 20, 2017 for U.S. Appl. No. 15/271,755; 25 pages.
PCT Search Report of the ISA for PCT/US2016/052824 dated Feb. 3, 2017; 6 pages.
PCT Written Opinion of the ISA for PCT/US2016/052824 dated Feb. 3, 2017; 6 pages.
U.S. Non-Final Office Action dated Mar. 3, 2017 for U.S. Appl. No. 14/694,540; 16 pages.
Response to Office Action dated Mar. 3, 2017 for U.S. Appl. No. 14/694,540, filed Jun. 1, 2017; 24 pages.
Notice of Allowance for U.S. Appl. No. 14/694,540 dated Jul. 31, 2017; 9 pages.
U.S. Non-Final Office Action dated Mar. 24, 2017 for U.S. Appl. No. 15/303,800, 39 pages.
Response to Office Action dated Mar. 24, 2017 for U.S. Appl. No. 15/303,800, filed Jun. 26, 2017; 22 pages.
Notice of Allowance dated Oct. 12, 2017 for U.S. Appl. No. 15/303,800; 16 pages.
PCT Search Report of the ISA for PCT Appl. No. PCT/US2015/059181 dated Sep. 7, 2016; 5 pages.
PCT Written Opinion of the ISA for PCT Appl. No. PCT/US2015/059181 dated Sep. 7, 2016; 12 pages.
PCT International Preliminary Report on Patentability dated May 18, 2017 for PCT Appl. No. PCT/US2015/059181; 11 pages.
Notice of Allowance for U.S. Appl. No. 15/312,063 dated Aug. 2, 2017; 17 pages.
PCT Search Report of the ISA for PCT Appl. No. PCT/US2015/059200 dated Jul. 21, 2016; 3 pages.
PCT Written Opinion of the ISA for PCT Appl. No. PCT/US2015/059200 dated Jul. 21, 2016; 13 pages.

PCT International Preliminary Report on Patentability dated May 18, 2017 for PCT Appl. No. PCT/US2015/059200; 11 pages.
PCT International Preliminary Report on Patentability dated Feb. 1, 2018 for PCT Appl. No. PCT/US2016/043266; 11 pages.
PCT Search Report of the ISA for PCT/US2016/060296 dated Mar. 10, 2017; 5 pages.
PCT Written Opinion of the ISA for PCT/US2016/060296 dated Mar. 10, 2017; 5 pages.
Restriction Requirement dated Jan. 3, 2018 for U.S. Appl. No. 15/342,478; 6 pages.
Response to Restriction Requirement dated Jan. 3, 2018 for U.S. Appl. No. 15/342,478, filed Mar. 2, 2018; 6 pages.
PCT Search Report of the ISA for PCT Appl. No. PCT/US2016/060343 dated Jul. 18, 2017; 3 pages.
PCT Written Opinion of the ISA for PCT Appl. No. PCT/US2016/060343 dated Jul. 18, 2017; 12 pages.
U.S. Non-Final Office Action dated Mar. 21, 2018 for U.S. Appl. No. 15/342,589; 25 pages.
Advisory Action dated Mar. 20, 2018 for U.S. Appl. No. 15/342,444; 3 pages.
Restriction Requirement dated Apr. 28, 2017 for U.S. Appl. No. 15/342,444; 9 pages.
Response to Restriction Requirement and Preliminary Amendment dated Apr. 28, 2017 for U.S. Appl. No. 15/342,444, filed May 19, 2017; 6 pages.
U.S. Non-Final Office Action dated Aug. 11, 2017 for U.S. Appl. No. 15/342,444; 22 pages.
Response to Aug. 11, 2017 Office Action for U.S. Appl. No. 15/342,444, filed Sep. 15, 2017; 20 pages.
Final Office Action dated Dec. 6, 2017 for U.S. Appl. No. 15/342,444; 18 pages.
Response to Final Office Action dated Dec. 6, 2017 for U.S. Appl. No. 15/342,444; Response filed Mar. 2, 2018; 16 pages.
PCT Search Report of the ISA for PCT Appl. No. PCT/US2016/060263 dated Jan. 10, 2017; 3 pages.
PCT Written Opinion of the ISA for PCT Appl. No. PCT/US2016/060263 dated Jan. 10, 2017; 6 pages.
Restriction Requirement dated Oct. 23, 2017 for U.S. Appl. No. 15/342,517; 6 pages.
Response to Restriction Requirement dated Oct. 23, 2017 for U.S. Appl. No. 15/342,517, filed Dec. 22, 2017; 1 pages.
PCT Search Report of the ISA for PCT/US2016/060309 dated Mar. 24, 2017; 6 pages.
PCT Written Opinion of the ISA for PCT/US2016/060309 dated Mar. 24, 2017; 10 pages.
Burns, et al.; "3D Circuit Integration Technology for Multiproject Fabrication;" MIT Lincoln Laboratory Presentation; Apr. 7, 2000; 15 pages.
Courtland; "Google Aims for Quantum Computing Supremacy;" Spectrum.IEEE.Org; North America; Jun. 2017; 2 pages.
Response to Non-Final Office Action dated Apr. 23, 2018 for U.S. Appl. No. 15/342,478, filed Aug. 23, 2018; 18 Pages.
Amendment filed on Apr. 30, 2019 for U.S. Appl. No. 15/684,337; 11 pages.
Amendment filed on Apr. 8, 2019 for U.S. Appl. No. 15/684,269; 17 pages.
Final Office Action dated Jul. 29, 2019 for U.S. Appl. No. 15/684,269; 25 Pages.
Notice of Allowance dated Jun. 19, 2019 for U.S. Appl. No. 15/684,337; 11 Pages.
Oyha, et al.; "Room Temperature Deposition of Sputtered TiN Films for Superconducting Coplanar Waveguide Resonators;" IOP Publishing; Superconducting Science Technology 27; Mar. 2014; 11 pages.
Tarniowy, et al.; "The Effect of Thermal Treatment on the Structure, Optical and Electrical Properties of Amorphous Titanium Nitride Thin Films;" Elseiver; Thin Solid Films 311; Apr. 1997; 8 pages.
PCT International Search Report of the ISA for Intl. Appl. No. PCT/US2016/043266 dated Dec. 5, 2016; 5 pages.
PCT International Written Opinion of the ISA for Intl. Appl. No. PCT/2016/043266 dated Dec. 5, 2016; 9 pages.
Non-Final Office Action dated Feb. 1, 2019 for U.S. Appl. No. 15/684,337; 10 Pages.

(56) References Cited

OTHER PUBLICATIONS

Notice of Allowance dated May 10, 2019 for U.S. Appl. No. 15/342,478; 13 pages.
Response to U.S. Non-Final Office Action dated Jan. 11, 2018 for U.S. Appl. No. 15/327,239; Response filed Apr. 9, 2018; 25 pages.
U.S. Final Office Action dated May 9, 2018 for U.S. Appl. No. 15/327,239; 24 pages.
Response to U.S. Non-Final Office Action dated Oct. 20, 2017 for U.S. Appl. No. 15/327,249; Response filed Apr. 19, 2018; 19 pages.
Notice of Allowance dated Jul. 9, 2018 for U.S. Appl. No. 15/327,249; 15 pages.
U.S. Non-Final Office Action dated Aug. 9, 2018 for U.S. Appl. No. 15/271,755; 29 pages.
Notice of Allowance dated Jul. 18, 2018 for U.S. Appl. No. 15/342,444; 11 pages.
Response to U.S. Non-Final Office Action dated Apr. 19, 2018 for U.S. Appl. No. 15/342,517; Response filed Jul. 17, 2018; 14 pages.
Final Office Action dated Jul. 29, 2019 for U.S. Appl. No. 15/684,269; 30 pages.
Final Office Action dated Oct. 23, 2018 for U.S. Appl. No. 15/342,478; 21 pages.
Non-Final Office Action dated Nov. 8, 2018 for U.S. Appl. No. 15/327,239; 26 pages.
Notice of Allowance dated Oct. 3, 2018 for U.S. Appl. No. 15/342,517; 13 pages.
Notice of Allowance dated Nov. 8, 2018 for U.S. Appl. No. 15/684,393; 8 pages.
Restriction Requirement dated Oct. 11, 2018 for U.S. Appl. No. 15/684,337; 8 pages.
Response to Restriction Requirement dated Oct. 11, 2018 for U.S. Appl. No. 15/684,337, filed Nov. 9, 2018; 10 pages.
Response to Office Action dated Aug. 9, 2018 for U.S. Appl. No. 15/271,755, filed Sep. 28, 2018; 16 pages.
Response to Office Action filed on Jan. 23, 2019 for U.S. Appl. No. 15/342,478; 9 pages.
U.S. Non-Final Office Action dated Apr. 23, 2018 for U.S. Appl. No. 15/342,478; 11 Pages.
U.S. Non-Final Office Action dated Apr. 19, 2018 for U.S. Appl. No. 15/342,517; 8 Pages.
Response to U.S. Final Office Action dated Dec. 6, 2017 for U.S. Appl. No. 15/342,444; Response filed May 4, 2018; 18 Pages.
U.S. Non-Final Office Action dated May 11, 2018 for U.S. Appl. No. 15/684,393; 15 Pages.
PCT International Preliminary Report dated May 17, 2018 for International Application No. PCT/US2016/060296; 7 Pages.
PCT International Preliminary Report dated May 17, 2018 for International Application No. PCT/US2016/060343; 9 Pages.
PCT International Preliminary Report dated May 17, 2018 for International Application No. PCT/US2016/060263; 8 Pages.
PCT International Preliminary Report dated May 17, 2018 for International Application No. PCT/US2016/060309; 8 Pages.
Notice of Allowance and Issue Fee due for U.S. Appl. No. 15/684,269, dated Jan. 14, 2020, 10 pages.

\* cited by examiner

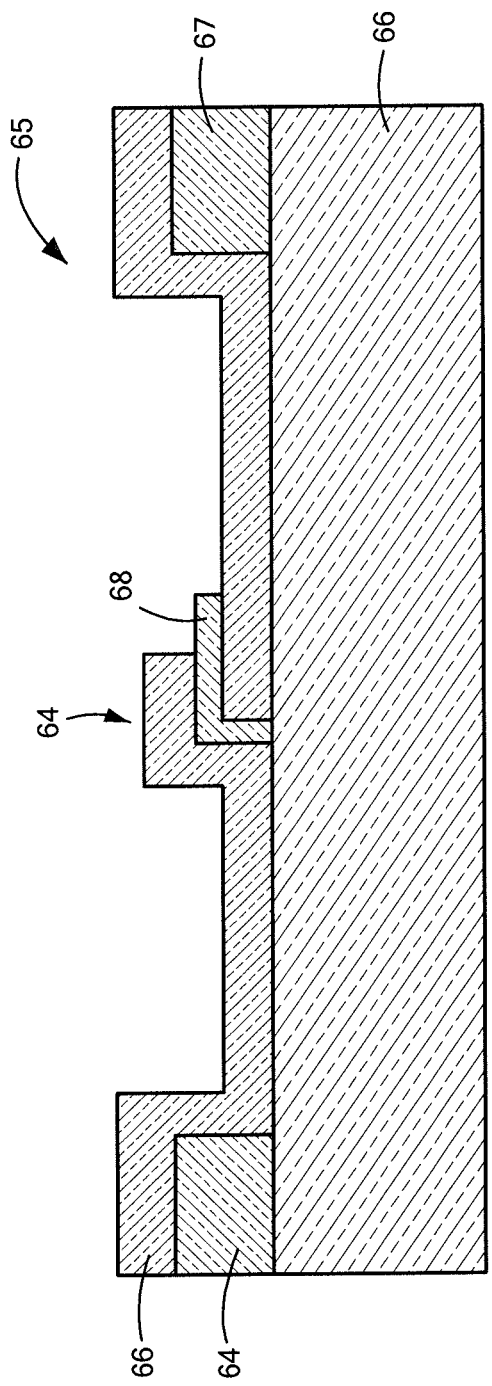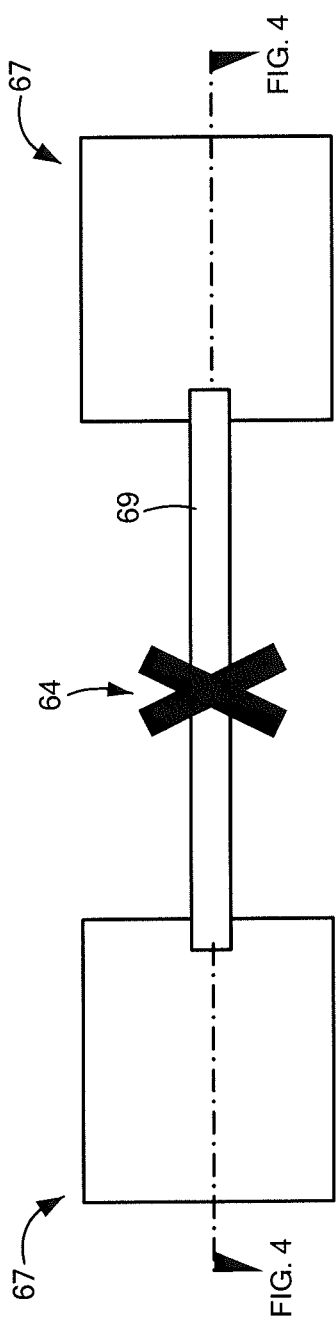
FIG. 4
FIG. 4A

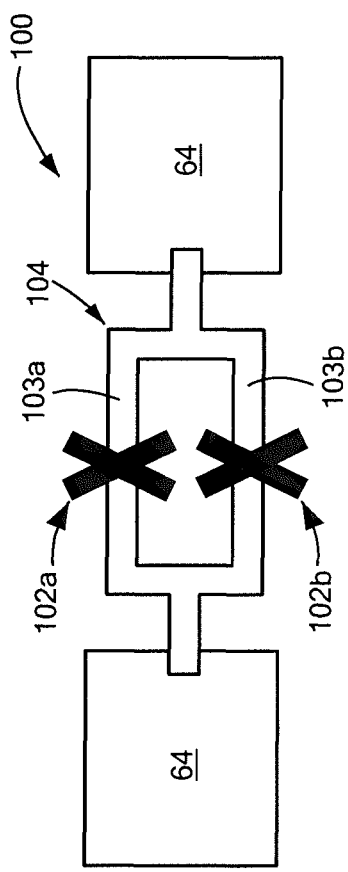
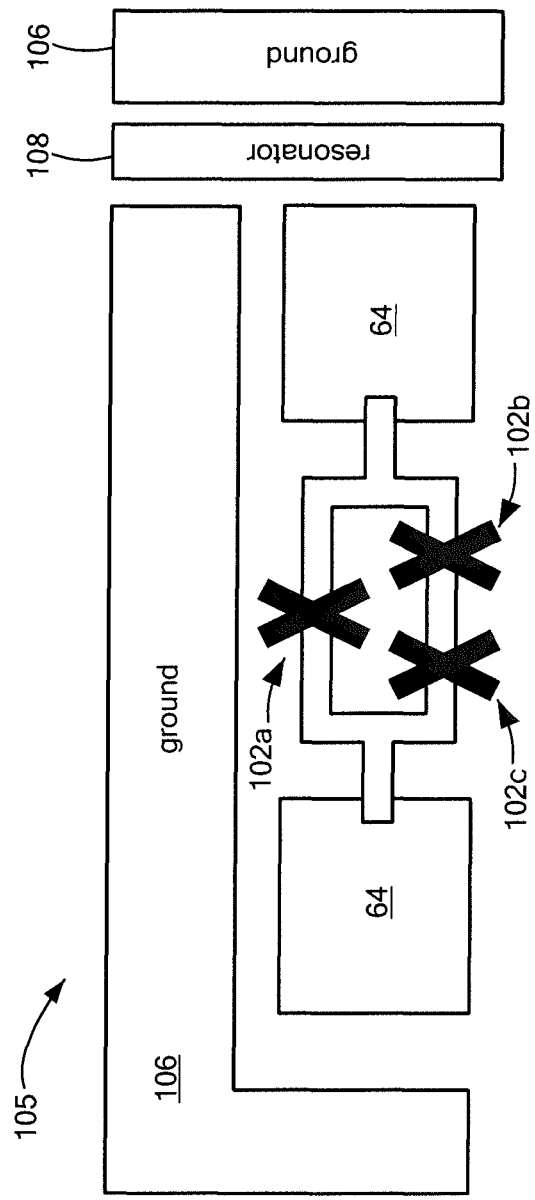
FIG. 7
FIG. 7A

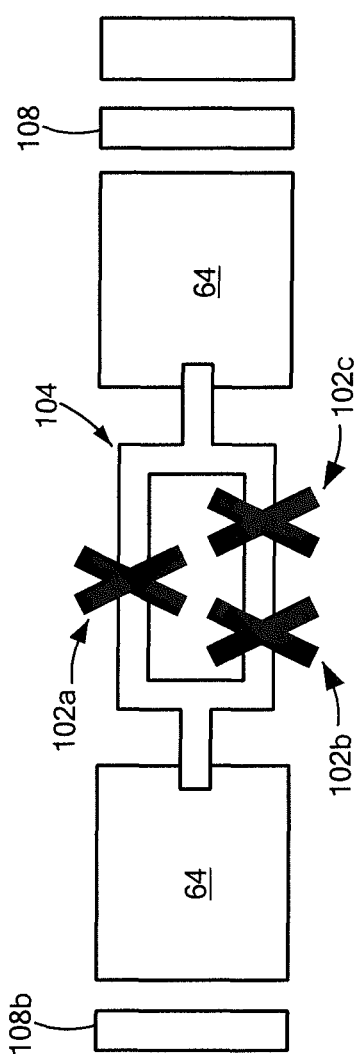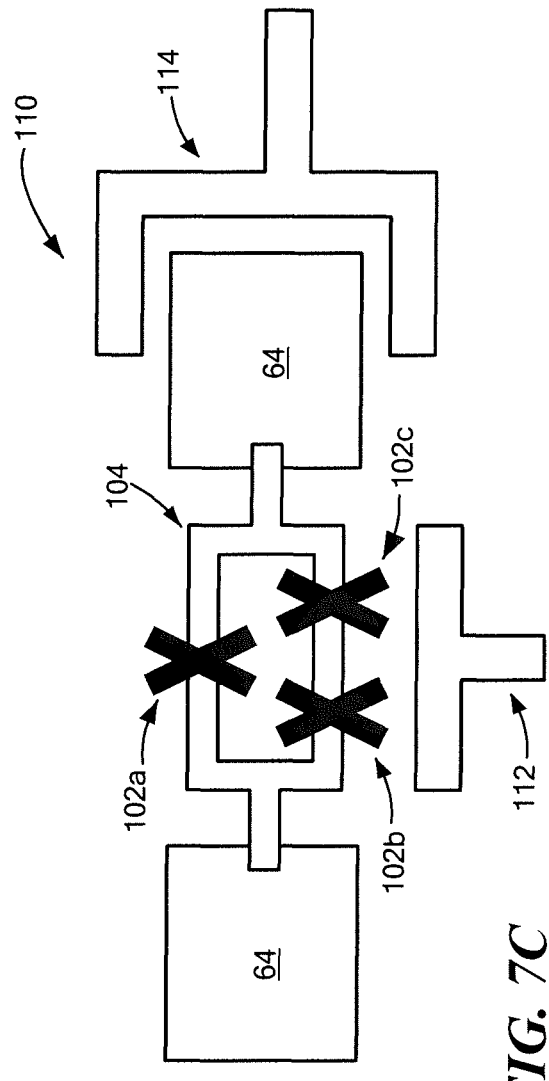
FIG. 7B
FIG. 7C

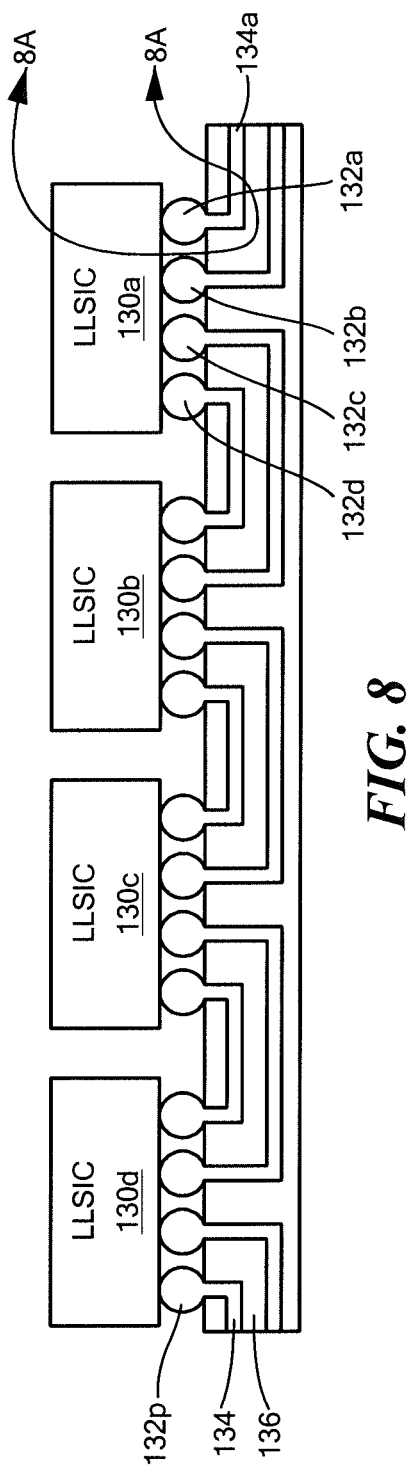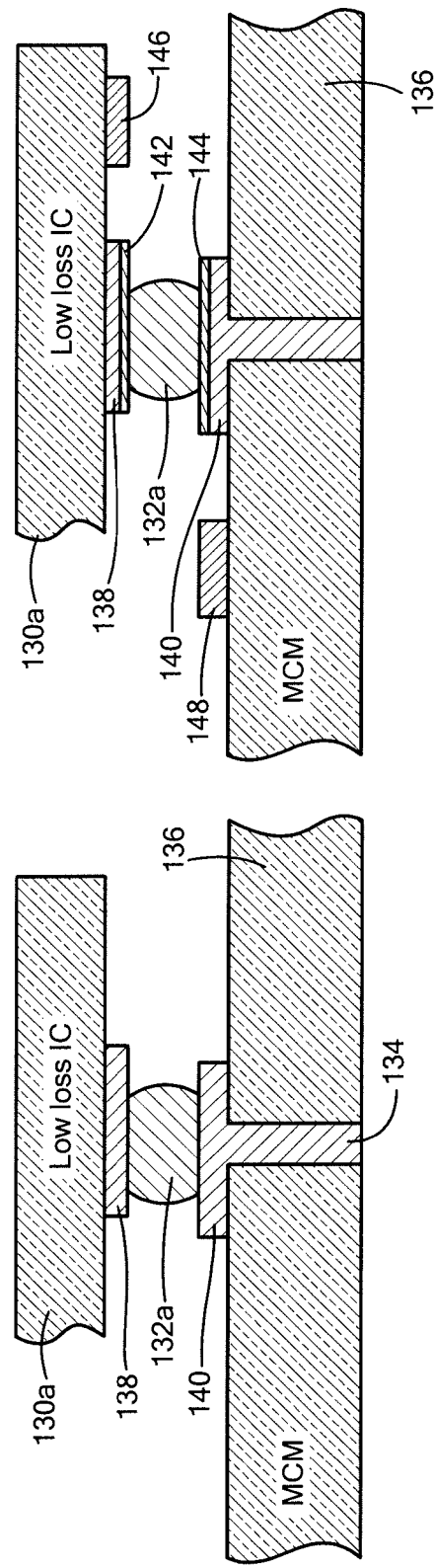
FIG. 8
FIG. 8A
FIG. 8B

SUPERCONDUCTING INTEGRATED CIRCUIT

CROSS REFERENCE TO RELATED APPLICATIONS

This application is a U.S. National Stage of PCT application PCT/US2016/043266 filed in the English language on Jul. 21, 2016, and entitled "SUPERCONDUCTING INTEGRATED CIRCUIT," which claims the benefit under 35 U.S.C. § 119 of provisional application No. 62/195,852 filed Jul. 23, 2015, which application is hereby incorporated herein by reference.

STATEMENT REGARDING FEDERALLY SPONSORED RESEARCH

This invention was made with Government support under Contract No. FA8721-05-C-0002 awarded by U.S. Air Force. The Government has certain rights in the invention.

FIELD

This disclosure relates generally to integrated circuits, and more particularly, to low loss superconducting integrated circuits.

BACKGROUND

As is known, there is trend toward miniaturization of electronic products such as mobile phones, tablets, digital cameras, and the like. There is also a demand for development of electronic products which have an increased number of functionalities and have increased electronic capabilities (e.g., increased speed, memory, and operational life). These trends have resulted in a demand for integrated circuits which enable these and other increased capabilities (e.g., increased density, computing power and extended operational life).

In particular, the foregoing trends drive a need for integrated circuits which utilize superconducting materials and properties (so-called "superconducting integrated circuits"). Superconductor materials have substantially no electrical resistance below a certain critical temperature, which may provide for increased performance in integrated circuit devices. The foregoing trend and demand also drives a need for low-loss superconducting integrated circuits and interconnect structures which enable assembly of superconducting integrated circuits.

As is also known, superconducting quantum circuits are a leading candidate technology for large-scale quantum computing. Long coherence times compared to logic gate times are necessary for building a fault tolerant quantum computer. In the case of superconducting quantum bits (qubits), coherence time improvements are attributable to a number of design changes for specific superconducting materials.

One indicator of the coherence time of a quantum integrated circuit is intrinsic quality factor $Q_i$. Titanium nitride (TiN) superconducting coplanar waveguide (SCPW) resonators may be provided having high intrinsic quality factors $Q_i$. Although many studies have been done on qubits, a major technical challenge is the lack of existing high performance materials, which meet the stringent requirements of qubit applications. Such requirements include: providing materials having a high intrinsic quality factor, keeping a substantially stoichiometric thin film composition across a wafer, wafer-to-wafer reproducibility, and stability over milli-Kelvine temperature range in addition to the mandatory requirements of scalability.

SUMMARY

Described herein are concepts, systems, circuits and techniques related to low loss superconducting integrated circuits. In one aspect of the concepts described herein, a superconducting integrated circuit includes at least one superconducting resonator. The superconducting resonator is provided from a substrate having a conductive layer disposed over a surface thereof. The conductive layer is provided from a substantially low stress polycrystalline Titanium Nitride (TiN) material having an internal resistance between about fifty megapascal (MPa) and about two hundred fifty MPa.

With this particular arrangement, a superconducting integrated circuit resonator having a high quality factor (Q) and low loss is provided. High-Q TiN, where the Q is measured by using, for example, a microwave resonator. The integrated circuits will include microwave resonators and/or quantum bits. Superconducting resonator is provided as any type of microwave resonator, including distributed—e.g., a coplanar waveguide (CPW) resonator, stripline resonator, microstrip resonator, coplanar strip resonator, puck resonator, and related structures,—and lumped element resonators comprising lumped capacitive and inductive elements coupled in parallel and/or in series, the capacitor formed by patterning a conductive layer deposited on a surface of a substrate, and the conductive layer including at least one conductive material, the at least one conductive material including a substantially low stress polycrystalline Titanium Nitride (TiN) material having an internal stress less than about two hundred fifty MPa (magnitude).

The superconducting integrated circuit may include one or more of the following features individually or in combination with other features. The TiN material may be a (200)-oriented polycrystalline, TiN material. The (200)-oriented, TiN material may be a single crystal, plasma etched and or cleaned TiN material having a 4-fold symmetry and in-plane rotational alignment which is an indication of a single crystal having desired characteristics. The substrate may include at least one of a silicon, deposited silicon, high resistive silicon, oxide coated silicon, silicon dioxide, glass, oxide etched silicon, oxide etched annealed silicon, oxide etched recrystallized silicon, aluminum oxide, sapphire, germanium, gallium arsenide, an alloy of silicon and germanium, and an indium phosphide material. The surface of the substrate may have at least one of an oxide, hydroxyl, hydride, nitride, fluoride, silicon nitride, hydrogenated nitride, and a hydrogenated fluoride material disposed thereon.

The conductive layer may have at least one opening provided therein. At least one of first and second opposing surfaces of the conductive layer may be a substantially concave or a substantially convex surface which may both produce very high Q. Concave surface produce tensile stress and convex surface will produce compressive stress. In one embodiment, the substantially concave and or convex surface may have an X-ray radius of curvature of about one hundred meters. The conductive layer may be annealed at a predetermined rate and temperature during fabrication of the conductive layer. The annealing process may provide for the at least one conductive material of the conductive layer changing from a first form of the conductive material to a second, different form of the conductive material to increase the quality factor of the at least one superconducting resonator.

In one embodiment, the TiN material provides the at least one superconducting resonator having an internal quality factor which is greater than about ten to the power of seven ($10^7$) at high powers (e.g. for circulating power in the resonator corresponding to an average photon number exceeding 10,000). The TiN material may provide the at least one superconducting resonator having an internal quality factor $Q_i$ which is greater than about ten to the power of six ($10^6$) at a low power single photon regime (i.e., for circulating power in the resonator corresponding to an average photon number of unity).

The at least one superconducting resonator may be provided as a coplanar waveguide (CPW) resonator. The CPW resonator may include a lumped element capacitor and inductor element coupled in parallel. The capacitor may be formed by patterning a conductive layer deposited on a surface of a substrate. The conductive layer may include at least one conductive material. The at least one conductive material may include a substantially low stress polycrystalline Titanium Nitride (TiN) material having an internal resistance between about fifty megapascal (MPa) and about two hundred fifty MPa. The at least one superconducting resonator may be designed to operate in at least one of a radio frequency (RF) region and a microwave frequency region. The superconducting integrating circuit may include at least one Aluminum or nobium based inductor. The superconducting integrating circuit may include a buffer layer disposed between the second surface of the substrate and the first surface of the conductive layer.

In another aspect of the concepts described herein, a method for fabricating a superconducting resonator includes disposing a conductive layer over a surface of a substrate. The conductive layer includes at least one conductive material. The at least one conductive material includes a substantially low stress polycrystalline Titanium Nitride (TiN) material having an internal stress between about fifty megapascal (MPa) and about two hundred fifty MPa.

The method additionally includes forming a resist layer on a surface of the conductive layer, patterning the resist layer, and forming an opening in a select portion of the resist layer and the conductive layer such that the opening extends to the surface of the substrate having a conductive layer disposed over a surface thereof. In an embodiment, the opening has a depth of between about ten nanometers and about ten micron in the substrate. The method also includes cleaning the opening formed in the conductive layer, and removing residual resist from the conductive layer surface.

The method may include one or more of the following features either individually or in combination with other features. The opening may be formed, for example, through a dry plasma etching process using at least one of a chloride etchant and a fluoride etchant. The residual resist may be removed using, for example, a wet etching process. Providing the substrate may include providing a substrate having a highly resistive surface such as providing an entire highly resistive silicon substrate. High resistive silicon will behave like an insulator during operation.

Providing the conductive layer may include providing a conductive layer having first and second opposing surfaces and an X-ray radius of curvature of greater than about one hundred meters. The conductive layer may include at least one conductive material. The at least one conductive material may include a substantially low stress (200)-oriented polycrystalline, TiN material having an internal stress between about fifty MPa and about two hundred fifty MPa.

Also, described herein are low-loss superconducting integrated circuits comprising titanium nitride (TiN) superconducting coplanar waveguide resonators having internal quality factors above $10^7$ at high powers and over $10^6$ at low power single photon regime.

Also described are superconducting interconnect structures for low-loss superconducting integrated circuits for flip chip assemblies. The superconducting interconnect structures described herein enable combining of multiple qubit die into a single package, while also enabling replacement, repair and upgrade of each qubit die if necessary. The superconducting interconnect technology described herein also enables assembling of multiple qubit die in two-dimensional (2D), two and one-half dimensional (2.5D) and three-dimensional (3D) packaging constructions.

In accordance with one aspect of the concepts described herein, a low-loss superconducting integrated circuits include at least one superconducting resonator device formed with a low stress, (200)-oriented polycrystalline, trenched titanium nitride (TiN) layer deposited on a silicon (Si) substrate having a high resistivity characteristic to provide high Q, low loss resonator structures suited for operation in the radio frequency (RF) and/or microwave frequency ranges. In preferred embodiments, the polycrystalline layer is provided from a (200)-oriented polycrystalline material having surfaces with an X-ray radius of curvature over 100 meters.

In one embodiment, the low-loss superconducting integrated circuit includes at least one coplanar waveguide (CPW) resonator device comprising a capacitor element and an inductor element connected in parallel. The capacitor element may be formed or otherwise provided on the low stress, (200)-oriented polycrystalline, trenched titanium nitride (TiN) layer by patterning or other techniques.

In one aspect of the concepts described herein, a low-loss superconducting integrated circuit includes at least one quantum bit (or more simply "qubit") and/or associated local bias devices. The qubit contains at least one integrated capacitor formed by patterning a low stress, (200)-oriented polycrystalline, trenched titanium nitride (TiN) layer deposited on a high resistive surface of an $S_i$ substrate wherein the TiN layer produces internal quality factors above $10^7$ at high powers and over $10^6$ at low power single photon regime. The qubits may, for example, be provided as any of: a flux qubit, a 2D transmon, a 3D transmon, a C-shunt flux qubit, or an L-shunt qubit.

In accordance with a still further aspect of the concepts described herein, an electronic package includes a superconducting and/or non-superconducting and/or partially superconducting substrate, and one or more superconducting integrated circuits coupled to the substrate either by superconducting and/or partially superconducting interconnects. In some embodiments at least one, some or all of the superconducting integrated circuits includes at least one superconducting resonator device formed from a low stress, (200)-oriented polycrystalline, trenched titanium nitride (TiN) layer deposited on an Si surface having a high resistivity characteristic to provide a high Q, low loss resonator structure suitable for operation in the radio frequency (RF) and/or microwave frequency ranges. Furthermore, one or more such a superconducting resonator devices may also be coupled to the substrate. Thus, in some embodiments both the substrate and the one or more superconducting ICs may have at least one or portion of superconducting resonator device coupled thereto.

In embodiments, each substrate includes at least two circuit layers and at least one set of vias. At least one circuit layer and/or via contains a superconducting and/or non-superconducting layer provided from a low stress, (200)-oriented polycrystalline material and/or an amorphous, titanium nitride (TiN) layer deposited on Si and/or oxide coated Si and/or metal/oxide coated Si surface.

In accordance with a further aspect of the concepts described herein, an electronic package includes a superconducting and/or non-superconducting substrate, and one or more superconducting integrated circuits coupled to the substrate by superconducting interconnects. The superconducting Interconnect comprises a superconducting bump and superconducting under bump metallurgy (UBM) where the bump reacts with at least part of the UBM at an interface thereof to provide a lower temperature melt superconducting interface. In one case, interface material melts at a lower temperature than that at which the bump and UBM melt. In some embodiments, a superconducting concentration gradient is provided at the interface which melts at lower temperature than bump materials.

Each superconducting integrated circuits include at least one superconducting resonator devices provided from a low stress, (200)-oriented polycrystalline, trenched titanium nitride (TiN) layer deposited on a surface of an Si substrate having a high resistivity characteristic so as to provide high Q, low loss resonator structures suitable for operation in the RF and/or microwave frequency ranges.

In accordance with a still further aspect of the concepts described herein, acryogenic electronic package includes a superconducting and/or non-superconducting and/or partially superconducting module, and one or more superconducting integrated circuits comprising at least one qubit coupled to the module by superconducting and/or partially superconducting interconnects one, some or all of the superconducting integrated circuits may include at least one superconducting resonator device formed with a low stress, polycrystalline preferably (200)-oriented, trenched titanium nitride (TiN) layer deposited on high resistive Si surface to provide high Q, low loss resonator structures preferably operated at radio frequency (RF) and/or microwave frequency region.

In accordance with yet, a still further aspect of the concepts described herein, a method of providing superconducting and/or partially superconducting interconnects, wherein the module and/or integrated circuits includes at least one superconducting and/or nonsuperconducting UBM connected to the superconducting trace, includes forming an opening (within the UBM) to the resist layer, depositing superconducting materials to fill the opening in the resist; remove resist in such a way that the method provides a superconducting bump having a height greater than resist thickness. The superconductors interconnects may be used to electrically/and or mechanically coupling the superconducting integrated circuits to substrates via the superconducting bumps to form a testing assembly to measure Qubit coherence and/or coupling.

In accordance with a yet further aspect of the concepts described herein, a cryogenic electronic package includes a superconducting and/or non-superconducting and/or partially superconducting module, and one or more superconducting integrated circuits contain at least one qubit coupled to the module by superconducting and/or partially superconducting interconnects. Each superconducting integrated circuits includes at least one superconducting resonator devices formed with a low stress, (200)-oriented polycrystalline, trenched titanium nitride (TiN) layer deposited on high resistive Si surface to provide high Q, low loss resonator structures preferably operated at radio frequency (RF) and/or microwave frequency region.

In accordance with yet a further aspect of the concepts described herein, a method of providing superconducting and/or partially superconducting interconnects in substrates and/or integrated circuits including at least one superconducting/and or nonsuperconducting UBM connected to a superconducting trace, comprises: forming a first resist layer, baked and adding second resist layer; forming an opening (within the UBM) to the first and second resist layer, depositing superconducting materials to fill the opening in the resist; removing resist in such a way that the method produces superconducting bumps having a height which is similar and/or taller than a resist thickness; electrically/and or mechanically coupling the superconducting integrated circuits to substrates via the superconducting bumps to form a testing assembly to measure qubit coherence and/or coupling.

In accordance with yet a further aspect of the concepts described herein, a low-loss superconducting integrated circuit includes one or more superconducting resonator devices formed with a concave and or convex surface topology having an X-ray radius of curvature preferably less than 100 meters, a (200)-oriented polycrystalline, trenched titanium nitride (TiN) layer deposited on high resistive Si surface having saturated and/or unsaturated silicon nitride to provide high Q, low loss resonator structures. In one embodiment, the resonator structures are suitable for use in the RF and/or microwave frequency ranges. By appropriate rapid thermal annealing, the TiN crystal structure may be changed to a TiN (200) crystal structure from a TiN(111) crystal structure which may enhance a Q characteristic of the low-loss superconducting integrated circuit.

At least some of the superconducting resonator devices may be formed having a concave and or convex surface having X-ray radius of curvature preferably less than 100 meters formed from a (200)-oriented single crystal, trenched and plasma etched titanium nitride (TiN) layer, deposited on a Si(100) substrate. Such a structure may show a four (4) fold symmetry and in-plane rotational alignment to provide high Q, low loss resonator structures suitable for operation in the RF and/or microwave frequency ranges.

In accordance with yet a further aspect of the concepts described herein, a superconducting integrated circuit, comprising at least one or part of a superconducting resonator, includes a substrate having first and second opposing surfaces; a conductive layer having first and second opposing surfaces, wherein the first surface of the conductive layer is disposed over the second surface of the substrate, and the conductive layer includes at least one conductive material that includes a low stress (e.g., 50-250 MPa) and or high stress (400 Mpa-4 GPa) polycrystalline material, preferably a (200)-oriented titanium nitride (TiN) material or another material having a high quality factor, to provide a high Q, low loss superconducting resonator. The integrated circuit wherein the substrate is a Silicon, high resistive silicon, oxide coated silicon, silicon dioxide, aluminum oxide (AlOx), sapphire, germanium (Ge), gallium arsenide (GaAs), an alloy of silicon and germanium, indium phosphide (InP), flex, rigid substrate and the second surface of the substrate is oxide, hydroxyl, hydride, nitride, fluoride, hydrogenated nitride, hydrogenated fluoride terminated and combination surface. The integrated circuit layer has an opening (e.g., trench) extending between at least a portion of the first and second surfaces of the conductive layer and at least portion of second surface of substrate.

In embodiments, the conductive layer may be disposed using any of a variety of different techniques, including, but not limited to: via PVD and or CVD and or sputtered and or magnetron sputtered and or reactive sputtered and or ALD and or PLD and or plasma enhanced and or plasma cleaned and or IMP PVD TiN. It is further possible that the conductive layer of integrated circuit is single and or multilayer, single crystal and or polycrystal and or amorphous TiN and or another high Q material. It is further possible that the integrated circuit including at least one Josephson junction and or inductor and or capacitor and or bias circuits.

In accordance with yet a further aspect of the concepts described herein, a low-loss superconducting integrated circuits is attached via a superconducting interconnect to a superconducting multi-chip module (SMCM). In embodiments, the superconducting interconnect is provided from under bump metals (UBMs). In embodiments, the low-loss superconducting integrated circuits and/or the SMCM include at least one superconducting resonator devices formed with a low stress having X-ray radius of curvature over 100 meters, polycrystalline preferably (200)-oriented, trenched titanium nitride (TiN) layer deposited on high resistive Si surface to provide high Q, low loss resonator structures preferably operated at radio frequency (RF) and/or microwave frequency region. Low-loss superconducting integrated circuits and or SMCM further may further include a Josephson junction and/or a capacitor and/or an inductor and or a bias line. It is further possible that an SMCM attached with one or more additional integrated circuits may be used to provide a system in a package. Examples of additional circuits include, but are not limited to: an amplifier, an RF front end, an adder, one or more shift registers, a ring oscillator, a processor, a memory, one or more logic circuits, a field programmable gate array (FPGA), a battery, one or more capacitors, one or more resistors, and one or more inductors. It is further possible that SMCM is multilayer normal conductor based MCM where each normal conductor layer is connected by micro-via. In one example, MCM has strip line routing shielded with ground plane and signal routing.

In accordance with yet a further aspect of the concepts described herein, low-loss superconducting integrated circuits may be coupled to an SMCM through an intermediate substrate with superconducting and/or a UBM interrupted interconnect. Low-loss superconducting integrated circuits and/or intermediate substrate and/or SMCM include at least one superconducting resonator devices formed with a low stress polycrystalline preferably (200)-oriented having X-ray radius of curvature over 100 meters, a trenched titanium nitride (TiN) layer deposited on high resistive Si surface to provide high Q, low loss resonator structures preferably operated at radio frequency (RF) and/or microwave frequency region. The integrated circuit and/or intermediate substrate and/or SMCM have at least one through via and or micro-via containing low stress titanium nitride (TiN) and or another high Q superconducting and or non-superconducting layer. Low-loss superconducting integrated circuits and or SMCM and or intermediate structure may further include a Josephson junction and/or a capacitor and/or an inductor and/or a bias line. It is further possible that at least part of the low-loss superconducting integrated circuits and/or intermediate substrate use high Q metal shielding.

In accordance with yet a further aspect of the concepts described herein, microbump technology capable of combining multi-die system on a chip (SOC) into a single package by joining a variety of arbitrary structures to produce various shape, size and pitch at the same package level. In embodiments, the microbump technology has a single microbump for finer pitch structure and one or more microbump arrays for larger pitch structures. Thus, such embodiments are capable of including both finer pitch as well as larger pitch structures in the same packaging layers. Multi-die SOC interconnects may be provided from superconducting microbump and under bump metallurgy (UBM) where a microbump will react with at least part of the UBM at an interface to provide an interface having a higher temperature melting point than prior art interfaces. In one illustrative embodiment, the interface melts at higher temperature than at least one component of the microbump and or UBM. It is also possible to create a concentration gradient at the interface which melts at higher temperature than the microbump and/or UBM. Multi-die SOC interconnect structures may be used where a superconducting Interconnect and a UBM grow together on a nano-grain low energy surface. This process allows creation of same diameter interconnects and UBMs and rest of the pad will be on the low energy surface which may be provided as a non-wettable surface. Interconnect side walls may contain nano, sub-micro and micro grain/particle structures to help prevent melt flow by reacting/diffusing with the low melt phase. It is possible that the interconnect may be surrounded by polymer matrix capable of reducing as well increasing viscosity at or below curing temperature until a final curing is performed.

In accordance with a still further aspect of the concepts described herein, a multi-qubit die SoC interconnect consists of a superconducting microbump and under bump metallurgy (UBM) where the microbump is provided so as to react with at least part of the UBM at the microbump-UBM interface to create higher temperature melt interface. In one case, the melting point of the interface is at a temperature which is higher than the melting point temperature of at least one of the components (i.e. higher than the melting point temperature of the bump or UBM). It is also possible to create a concentration gradient at the interface which melts at higher temperature than the microbump and/or the UBM. In embodiments, the multi-qubit die SOC interconnect structure exists where a superconducting Interconnect and a UBM grow together on a nano-grain low energy surface. This technique allows creation of same diameter interconnect and UBM and rest of the pad will be provided on a low energy surface, non wettable surface. Superconducting Interconnect side walls may contain nano, sub-micro and micro grain/particle structures. Such structures may help to prevent melt flow by reacting/diffusing with a low melt phase. At least one of the multi-qubit die SoC contains a through silicon via (TSV) and or a redistribution layer. Such a die having a TSV and/or a redistribution layer may use a second superconducting microbump technology to attach multi die SoC to a superconducting multi-chip module (SMCM) and/or an organic and/or a ceramic and/or a glass substrate. At least one of the SMCM and/or organic and/or ceramic and/or glass substrate containing a through via and/or a blind via and/or a stacked via and/or a staggered via using a third superconducting microbump technology to attach the SMCM to the organic substrate. Interconnect density decreases and pitch increases with increasing interconnect level. It is possible that both first and second and/or third interconnect may be surrounded by a polymer matrix at least once capable of reducing as well increasing viscosity at, or below, a curing temperature until final curing is completed.

In accordance with a yet further aspect of the concepts described herein, a superconducting microbump technology capable of combining multi die SoC into a single package by joining a variety of arbitrary structures to produce various shape, size and pitch at the same package level. The microbump technology may be provided having a single superconducting microbump for finer pitch structure and one or multiple superconducting microbump arrays for larger pitch structures. This provides an interconnect system and technique capable of maintaining finer pitch as well as larger pitch structures in the same packaging layers.

In embodiments, A multi-qubit die SoC interconnect consists of a superconducting microbump and under bump metallurgy (UBM) where the microbump will react with at least part of UBM at the interface to create an interface having a relatively high melting point temperature at the melt interface. In one case, an interface may be provided having a melting point temperature which is a higher temperature than of at least one of the component of the microbump and or UBM. It is also possible to create a concentration gradient at the interface which melts at higher temperature than either the microbump and/or the UBM. In embodiments, a multi-qubit die SoC interconnect structure is provided in which an interconnect and a UBM may be grown together on a nano-grain, low energy surface. This technique allows creation of an interconnect and a UBM having the same diameter while remaining portions of the pad will be with a non-wettable surface having a low surface energy. Interconnect side walls may contain nano, sub-micro and micro grain/particle structure also help to prevent melt flow by reacting/diffusing with the low melt phase. At least one of the multi-qubit die SoC containing a through silicon via (TSV) and/or a redistribution layer. The die having TSV and/or redistribution layer and including a second superconducting microbump technology to attach a multi-die SoC to SMCM and/or organic and/or ceramic and/or glass substrate. At least one of the SMCM and/or organic and/or ceramic and/or glass substrate containing a through via and/or a blind via and/or a stacked via and/or a staggered via and using a third superconducting microbump technology to attach an SMCM to an organic rigid-flex and/or an organic rigid with a detachable flex structure. This technique provides interconnect density decreases, along with pitch increases with increasing interconnect level. It is possible that both first and/or second and/or third Interconnect surrounded by polymer matrix at least once capable of reducing as well increasing viscosity at or below curing temperature till final curing.

BRIEF DESCRIPTION OF THE DRAWINGS

Features and advantages of the concepts, systems, circuits and techniques disclosed herein will be apparent from the following description of the embodiments taken in conjunction with the accompanying drawings in which:

FIG. 4 is a cross-sectional view of an aluminum junction;

FIG. 4A is a plan view of a Josephson junction disposed between a pair of high Q materials formed in a substrate;

FIG. 7 is a plan view of a building block of a passive or active superconducting circuit;

FIG. 7A is a plan view of a building block of a passive or active superconducting circuit having a resonator;

FIG. 7B is a plan view of a building block of a passive or active superconducting circuit having a resonator and a pair of ground planes;

FIG. 7C is a plan view of a building block of a passive or active superconducting circuit having a pair of bias lines;

FIG. 8 is a side view of a plurality of low loss superconducting integrated circuits coupled to a multichip module (MCM) substrate;

FIG. 8A is an enlarged view of a portion of FIG. 8 taken across lines 8A-8A;

FIG. 8B is a side view of a low loss superconducting integrated circuit attached by a superconducting interconnect to a MCM;

DETAILED DESCRIPTION

Figure 1:
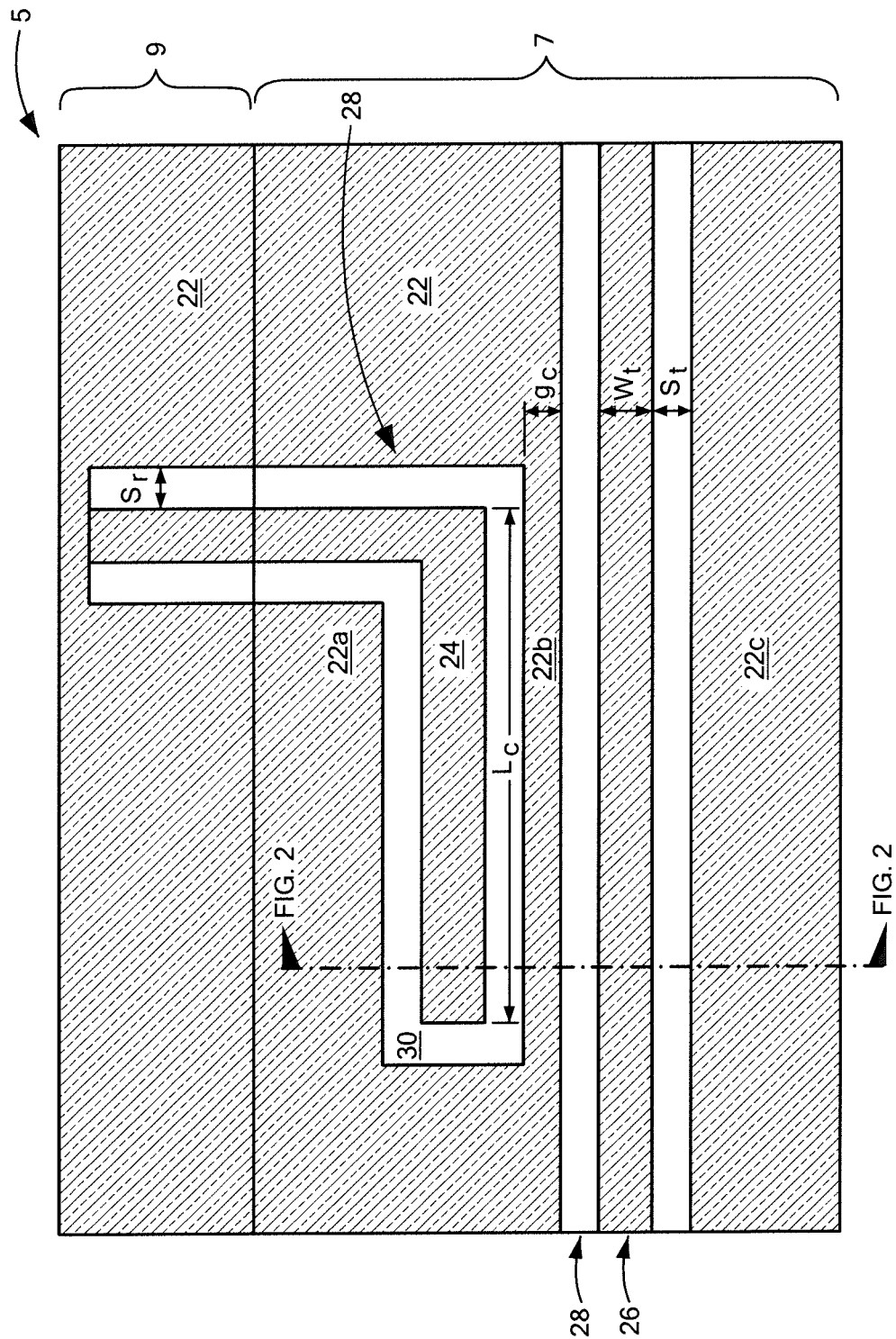
FIG. 1 is a plan view of a superconducting coplanar waveguide (CPW) resonator.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected. Embodiments of the present disclosure and associated advantages may be best understood by referring to the drawings, where like numerals are used for like and corresponding parts throughout the various views. It should, of course, be appreciated that elements shown in the figures are not necessarily drawn to scale. For example, the dimensions of some elements may be exaggerated relative to other elements for clarity.

Definitions

For convenience, certain introductory concepts and terms used in the specification are collected here.

As used herein, a "high Q metal" or "high Q material" (or so-called high Q metals or "high Q materials") refers to materials in the 20-400 nm film form capable of producing a high quality factor and are defined as materials in a resonator and/or a superconducting resonator which produce a quality factor in the range of about a few thousands to several millions in the low power and/or single photon region. Illustrative materials include, but are not limited to: niobium (Nb), niobium nitride (NbN), titanium-niobium-nitride (TiNbN), titanium nitride (TiN), aluminum (Al), and rhenium (Re), diamond, graphine etc.

The phrase "quality factor" can be used to describe how long stored energy remains in a resonator. It should be appreciated that there is a difference between a total quality factor and an internal quality factor Qi. Internal quality factor Qi is an intrinsic characteristic of a resonator. A total or loaded quality factor QL, on the other hand, also depends upon other properties, including, but not limited to, coupling to an environment (i.e. an environment external to the resonator) and a feedline. A coupling quality factor (Qc) describes how strong (or closely) the resonator is coupled to the feedline.

As used herein, the term "resonator" refers to a device or system that exhibits resonance at some frequencies. A resonator may be described by two characteristics: (1) a resonance frequency; and (2) a quality factor. Superconducting resonators play a significant role in qubit design, interqubit coupling, quantum information storage, and quantum-state dispersive readout because of their low signal-to-noise ratio and low power dissipation. In addition, as part of the concepts sought to be protected herein, it has been recognized that because superconducting qubits may be fabricated using the same materials and processes as resonators described herein, the study of the loss mechanisms limiting the qualify factor Q in these resonators may prove to be a useful and relatively simple tool for understanding the fabrication-dependent limits to qubit coherence times. Superconducting resonator is provided as any type of microwave resonator, including distributed—e.g., a coplanar waveguide (CPW) resonator, stripline resonator, microstrip resonator, coplanar strip resonator, puck resonator, and related structures,—and lumped element resonators comprising lumped capacitive and inductive elements coupled in parallel and/or in series, the capacitor formed by patterning a conductive layer deposited on a surface of a substrate A bit is the most basic unit of classical logic and can occupy one of two discrete states, 0 or 1. A quantum bit, or 'qubit,' on the other hand, can be an arbitrary superposition of the eigenstates |0> and |1>. A quantum computer is comprised of logic gates that operate on an ensemble of quantum bits.

Where n classical bits can only exist in one of the 2n possible states, a quantum processor with n qubits can be placed in a complex superposition state of all 2n permutations, containing exponentially more information than a conventional processor.

"Superconducting qubits" are manifested as (e.g. an integrated circuit) electronic circuits comprising lithographically defined Josephson junctions, inductors, capacitors, transmission lines and interconnects. When cooled to dilution refrigerator temperatures, these circuits behave as quantum mechanical "artificial atoms," exhibiting quantized states of electronic charge, magnetic flux, or junction phase depending on the design parameters of the constituent circuit elements. The Josephson junction behaves as a non-linear dissipationless inductor.

Superconducting qubits are engineered to have discrete, anharmonic spectra—an "artificial atom" fabricated using standard lithographic techniques.

"Superconducting artificial atoms" are electronic circuits comprising lithographically defined Josephson tunnel junctions, inductors (L), capacitors (C), and interconnects. Conceptually, they begin as linear LC resonant circuits (i.e., simple harmonic oscillators), which are then made anharmonic to varying degrees by adding a nonlinear inductive element, the Josephson junction (JJ). When cooled to dilution refrigerator temperatures (~20 millikelvin), these superconducting circuits behave as quantum mechanical oscillators (e.g., "artificial atoms") exhibiting quantized states of electronic charge, magnetic flux, or junction phase depending on the design parameters of the constituent circuit elements.

Three fundamental superconducting qubit modalities are: charge, flux, and phase. Each includes one or more Josephson junctions. The qubit comprises the two-lowest states and is addressed at a unique frequency, $f_{01}$. Qubit modalities represented include charge, quantronium, flux, 2D transmon, fluxonium, and 3D transmon qubits.

The term "superconducting qubit" generally refers to the ground and first-excited state of a superconducting artificial atom. Due to the anharmonicity imparted by the Josephson junction, the ground and first-excited states may be uniquely addressed at a frequency, $f_{01}$, without significantly perturbing the higher-excited states of the artificial atom. These two-lowest states thereby form an effective two-level system (i.e., a pseudo-"spin-1/2" system), and it is this degree of freedom that is used as the qubit, a quantum bit of information. Qubit participates in quantum annealing cycle and settle into one of two possible final states (0,1). Qubit used real valued constant (weight) which influences qubit's tendency to collapse into two possible final states.

The term "coupler" as used herein refers to a physical device that allows one qubit to influence another qubit. An Inductor and/or a Josephson junction can be a part of coupler. A coupler may be characterized by a real valued constant (strength) that indicates controls or influence exerted by one qubit on another.

As quantum mechanical objects, superconducting qubits can be coherently controlled, placed into quantum superposition states, exhibit quantum interference effects, and become entangled with one another. The time scale over which a superconducting qubit maintains this type of quantum mechanical behavior, and thereby remains viable for quantum information applications, is generally called the "coherence time." The rate at which the qubit loses coherence is related to its interactions with the uncontrolled degrees of freedom in its environment.

The term "interposer" as used herein, refers to and includes any structure capable of electrically interconnecting and/or magnetically and/or inductively and/or capacitively coupling arrays of superconducting conductors on two opposing circuitized substrates using extremely small superconductive and or partially superconductive elements such as micro-bumps, solder paste or conductive paste, as well as by using conductive and or superconductive thru-holes. Such an interposer, as defined herein, includes at least one dielectric layer (and may include many) and at least two external superconductive circuit layers (and possibly one or more internal superconductive circuit layers) wherein the layers may each include selective and or a density array of contact locations. Examples of dielectric materials include such materials as high resistive silicon, silicon oxide coated Si, silicon nitride coated Si, selective silicon oxide coated Silicon, selective silicon nitride coated Silicon, selective or entire low loss organic (e.g., BCB) coated Silicon and combination. Examples of conductive and or superconductive thru-holes as defined herein include materials as niobium (Nb), niobium nitride (NbN), titanium-niobium-nitride (TiNbN), titanium nitride (TiN), aluminum (Al), rhenium (Re), tungsten, silicide, diamond or any other possible superconducting metal and or superconducting nitride and combination. In one example, conductive and or superconductive thru-holes as defined herein include at least single and or multilayer Titanium nitride where part of the Titanium nitride can be used as Silicon and titanium etch barrier. It is further possible to use titanium nitride single and or multilayer materials with multiple composition and or concentration gradient where at least one composition and or concentration is superconducting during device operation.

The term "superconducting multi-chip module (SMCM)" as used herein includes at least one dielectric layer (and may include many) and at least one superconductive circuit layers (and possibly one or more internal superconductive circuit layers) deposited on the base substrate (e.g. Si or high resistive Si) using thin film technology. It is further possible to include one superconductive via and or superconducting pad wherein the superconducting pad containing under bump metals. Examples of dielectric materials include such materials as silicon (Si), high resistive silicon, silicon oxide as dielectric on Si, silicon nitride as dielectric on Si, selective silicon oxide on Silicon, selective silicon nitride on Silicon, selective or entire low loss organic (e.g., BCB) coated Silicon and combination. Examples of superconductive circuits, vias and pads as defined herein include materials as niobium (Nb), niobium nitride (NbN), titanium-niobium-nitride (TiNbN), titanium nitride (TiN), aluminum (Al), rhenium (Re), or any other possible superconducting metal and or superconducting nitride and combination. A substrate may have a Josepson junction and or an embedded Josephson junction. It is further possible to use integrated and or embedded capacitors, inductors, resistors. Patterned NbN can act as inductor. Capacitor may be planer, parallel plate, interdigited and combinations thereof. Examples of materials from which resistors may be provided include, but are not limited to: platinum, molybdenum, molybdenum nitride and combinations thereof. The substrate can further have dielectric bridges, crossovers, air bridges and combinations. The term "superconducting multi-chip module (SMCM)" may be used when at least part of the circuits are superconducting during operation and used superconducting and or normal via between superconducting circuits for interconnects. Superconducting multi-chip module (SMCM) can have normal UBM conductor for heterogeneous integration as well as to protect the superconducting pad. We defined "superconducting multi-chip module (SMCM)" when at least part of the circuit is normal conductor and part of superconducting during operation. Superconducting multi-chip module (SMCM) can have active element such as various size Josephson junctions and passive elements such as inductors, resistors, transformers, and transmission lines. In one example, Superconducting multi-chip module (SMCM) is a niobium-based integrated-circuit fabrication process appropriate for integrating superconducting chips. It is based on four Nb metal layers separated by PECVD silicon oxide dielectric. It utilizes I-line (365 nm) photolithography and planarization with chemical-mechanical polishing (CMP) for feature sizes down to 0.8 micron. There are four superconducting Nb layer and used Ti—Pt—Au as under bump metal layer. Superconducting vias are created between metal layers. In a typical process, vias are etched into PECVD $SiO_2$ dielectric and filled with niobium metal of the subsequent superconducting layer. Superconducting multi-chip module (SMCM) may be used to assemble multiple superconducting and or normal chips. Similarly, superconducting single-chip module (SSCM) may be used to assemble a single superconducting or normal chip. The term "superconducting module" or "superconducting substrate" includes both superconducting multi-chip module (SMCM) and superconducting single-chip module (SSCM). We use the term "normal module" or "normal substrate" which includes both multi-chip module (MCM) and single-chip module (SCM). Both superconducting and normal module able to attach superconducting and or normal conducting chips.

We defined "cryogenic electronic packaging" as integration and packaging of electronic components for cryogenic (77° K and below) applications. It is possible cryogenic electronic package can be used for room temperature electronics as well. For example interface electronics which needs to interface between cryo and room temperature electronics able to operate at both temperature zone. It also possible that cryogenic electronic package can be used for specific temperature operation (e.g., 4-10° K, below 100° mK). For example superconducting niobium electronics operates around 4-8° K and below, whereas superconducting Aluminum electronics operates at around 100° mK and below.

The term "under bump metal (UBM) "or" under bump metallization (UBM)" as used herein refers to structures which include materials which provide a low resistance electrical connection to the superconducting pad. A UBM may adhere well both to the underlying superconducting pad and to the surrounding superconducting circuits passivation layer, hermetically sealing the superconducting circuits from the environment. In some cases, a UBM may provide a strong barrier to prevent the diffusion of other bump metals into the superconducting circuits. A top layer of a UBM must be readily wettable by the bump metals, for solder reflow. In one embodiment a UBM uses multiple different metal layers, such as an adhesion layer, a diffusion barrier layer, a solderable layer, and an oxidation barrier layer. It is further possible that the UBM layers are compatible metals which in combination have low internal mechanical stresses. Example of materials from which a UBM may be provided include, but are not limited to: 20 nm Ti-50 nmPt-150 nmAu, 10 nmTi-50 nm Au, 5 nm Ti-5 nm Pt-5 nm Au-1000 nm Indium, 5 nm Ti-5 nm Pt-5 nm Au-1000 nm Sn, 50 nm Pt-100 nm Au, 5 nm Ti-500 nm In, 20 nm Ti-1000 nm In, Ni—Au, Ni—Pd—Au, Pd—Au, Ti—TiN, Ti—TiN—Ti—Au, Ti—TiN—Ti—In, Ti—TiN—Ti—Sn, Ti—Sn—In etc.

The term "superconducting interconnect" or "partially superconducting interconnect" as used herein refers to structures including at least one superconducting bump and at least one UBM to create electrical and or mechanical connection between two superconducting circuits. We defined "superconducting interconnect" when superconducting bump and superconducting UBM create superconducting interconnect between two superconducting circuits during operation. We also defined "superconducting interconnect" when superconducting bump and normal UBM conductor create superconducting interconnect between two superconducting circuits during operation. Here normal UBM conductor become superconducting due to proximity effect. We defined "partially superconducting interconnect" when superconducting bump and normal UBM conductor create normal conductor interconnect between two superconducting circuits during operation. Here normal UBM conductors dominate interconnect conductance although part of the interconnect is superconducting due to superconducting bump. In one example superconducting interconnect use as Al-UBM-Indium-UBM-Al or Nb-UBM-In-UBM-Nb. Examples of initial interconnect composition prior to bonding with second superconducting substrate include, but are not limited to: Ti(5 nm)-Au(20 nm)-8 um In, Ti(5 nm)-Au (100 nm)-8 um In, Ti(5 nm)-Au(50 nm)-8 um In, Ti(5 nm)/Pt(20 nm)/Au(20 nm)+8 um In, Ti(5 nm)/Pt(20 nm)/Au(20 nm)+8 um In, Ti(5 nm)/Pt(50 nm)/Au(100 nm)+8 um In, Ti(5 nm)/Pt(50 nm)/Au(150 nm)+8 um In, 8 um Indium-1 um tin, 4.5 um Indium-4.5 um tin, 6 um Silver bump with 2 um In, 5 nmTi-6 um Ag-5 nmTi-50 nmPt-100 nmAu-2 um In, Al—In, Pb—In, Pb—Ti—In, Pb—Sn—In, Pb—Sn—In—Au(10 nm). Nb—Pb—Sn—In, Nb—Pb—In, Nb—Ti(5 nm)-Pb(8 um)-In(2-5 um), 48 Sn-52 In etc. In one example, a total interconnect resistance for an Al based superconducting substrate may be calculated as: interface resistance of Al-UBM+ interface resistance of (UBM-In)+ interface resistance of (In-UBM)+ interface resistance of UBM-Al.

In this example, it is assumed that an Al pad is used for both superconducting integrated circuits and or modules for creating superconducting and or partially superconducting interconnects, assuming UBM resistance negligible in the range of nano ohm and Indium, aluminum superconducting during device operation. R(Al-UBM): contact resistance and R(UBM-In):interface resistance between bump and UBM. If Indium is used as a material from which to provide a UBM, then a Total Resistance (TR) may be computed as TR=2R (Al-UBM) assuming Indium to indium mixing much better and indium is superconducting. In this case, a contact resistance [R(Al-UBM)] will be superconducting due to proximity. So, keeping same materials as UBM as well as bump has many benefits other than adding multiple materials.

Figure 2:
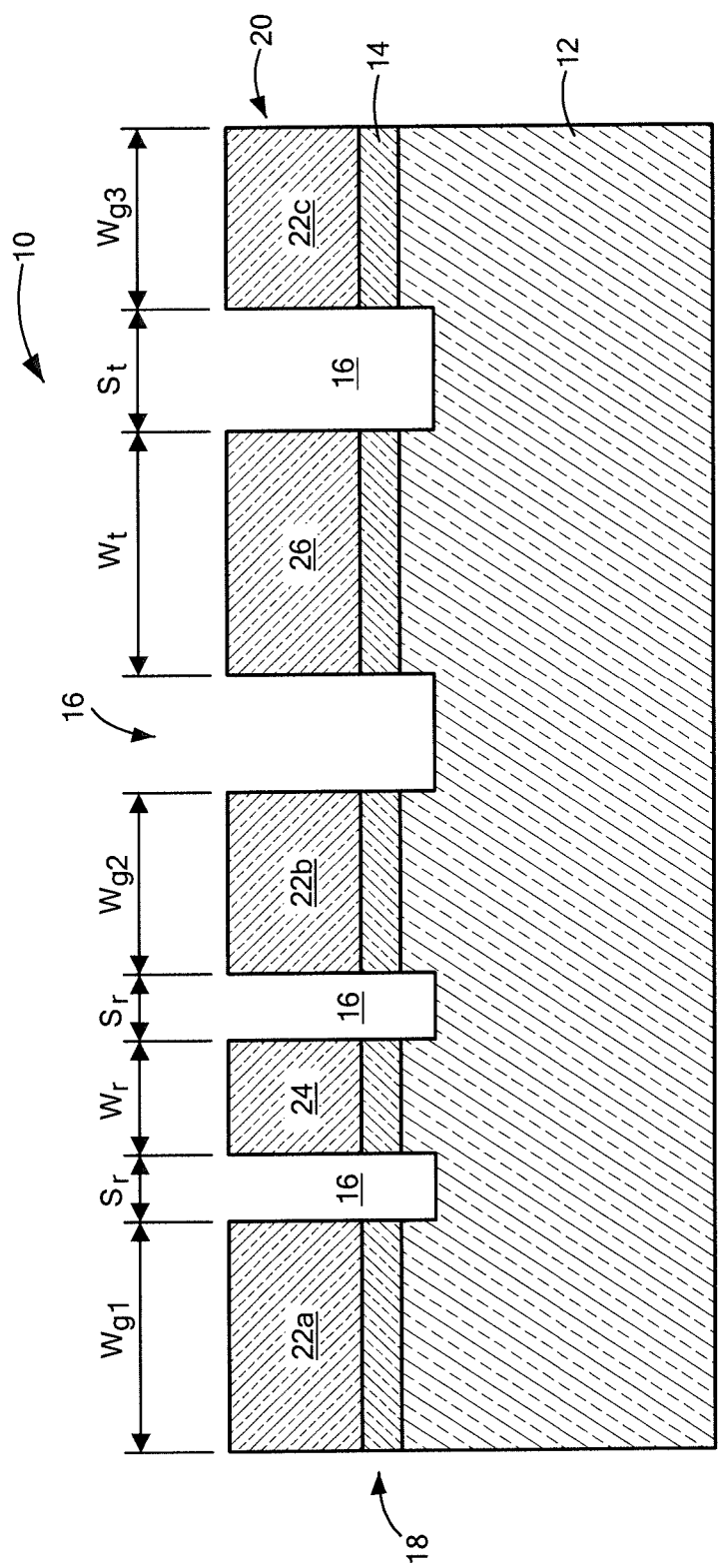
FIG. 2 is a cross-sectional view of the CPW resonator taking across lines 2-2 of FIG. 1.

Referring now to FIGS. 1 and 2 in which like elements are provided having like reference designations, a superconducting co-planar waveguide (CPW) resonator 5 includes a first portion 7 corresponding to a resonator-to-feed-line coupling portion and a second portion 9 corresponding to one end of the CPW resonator shorted to a ground plane. As may be most clearly visible in FIG. 2, the resonator-to-feedline coupling portion 7 comprises a substrate 12 having an optional buffer layer 14 disposed over a first surface thereof. Substrate 12 may be provided as a hydrogen and/or fluoride and/or nitride terminated substrate. Alternatively, substrate 12 may be provided having a native oxide layer. Alternatively still, substrate 12 may be provided from high resistive Silicon (Si) having resistivity in the range of 3 kiloohm-cm to 20 kiloohm-cm or higher, or as a high purity Si substrate or as an oxide coated substrate or a sapphire substrate. It should be appreciated that, in general, a high resistive silicon or sapphire is good for lower loss.

A plurality of trenches 16 are formed or otherwise provided in the substrate and buffer layer to define a plurality of raised regions (or islands) 18. A conductive layer 20 is disposed over optional buffer layer 14 in the raised regions to provide conductors 22a-22c, 24, 26. The conductive layer may be provided from a high Q metal such as titanium nitride (TiN) which form the resonator-to-feed-line portion of the CPW structure 7. Trench depth can be in the range of 10 nm to 100 microns. It is further possible to increase trenches to few hundred microns depending upon substrate thickness. Trench can have same buffer layer as buffer layer 14 or it can have a different buffer layer. For example, trenches can have oxide and/or hydroxide and/or fluoride and/or chloride based buffer layer when the trenches are formed during resonator patterning through the silicon nitride buffer layer (14). The trenches can have the same buffer layer as 14 when trenches are formed prior to buffer layer 14 and conductive layer 20 deposition. It is further possible to use hydrogen and/or fluoride and/or nitride terminated trench or trench with native oxide.

In one example, high-Q resonator films were deposited on 50-mm C-plane sapphire and or Si wafers. The wafers were cleaned in piranha solution (sulfuric acid and hydrogen peroxide) prior to loading into the deposition system. The wafers were annealed in the deposition system at RT-900 C to facilitate outgassing and sapphire surface reconstruction, after which 250 nm of aluminum and or other Q material was deposited at a growth rate of 0.025 nm/s and a substrate temperature of 150 C. The high-Q aluminum was patterned (contact lithography and wet-etching and or dry etching) into the following device features: shunt capacitors, coplanar waveguide (CPW) resonators, ground planes, and optical alignment marks.

In particular, the conductive layer 20 forms a CPW ground plane 22 (with ground plane portions 22a, 22b, 22c having widths $W_{g1}$, $W_{g2}$, $W_{g3}$ visible in FIG. 2), a resonator center line 24 having a width $W_r$ disposed between and spaced apart from ground plane portions 22a, 22b by a distance $S_r$ and a feed line 26 having a width $W_t$ and disposed between and spaced apart from ground plane portions 22b, 22c by a distance $S_t$. The length of the capacitor elbow is Ic and the distance between through line gap and the capacitor elbow gap is gc. The width of center conductor (feedline) is wt, resonator center line width is $W_r$, the gap between the center conductor and the ground is $S_r$.

It is, of course, also possible to form the planar geometry of a capacitively coupled CPW resonator where the resonator is formed via a center conductor having a width W, separated from the lateral ground planes by a gap having a width S. Resonators with various center conductor lengths l aiming to design fundamental frequencies $f_0$ in the GHz range (1-10 GHz) may also be used. The center conductor is coupled via so-called "finger capacitors" to the input and output transmission lines. To achieve larger coupling, finger capacitors formed from single or multiple pairs of fingers with appropriate length $L_f$, width $w_f$, and separation $S_f$ may be used. It is further possible that the center conductor is coupled via gap capacitors to the input and output transmission lines. For small coupling capacitances of gap capacitors with appropriate widths $W_g$ should be used.

Feed line 26 is used for excitation and readout. The length of meandered CPW resonator line 24 can be adjusted for a specific fundamental frequency. Design parameters used to make such a frequency adjustment include, but are not limited to a length $l_c$ of capacitor elbow portion 28 of the CPW resonator structure and a distance between an edge of a through line gap 29 and an edge of a resonator gap 30 $g_c$ as well as a width $w_t$ of feed line 24 and the width $s_t$ of the gap between an edge of the feed line 24 and an edge of the ground plane region 22c.

It should, of course, be appreciated that the CPW resonator described in conjunction with FIGS. 1 and 2 is merely one example and that other resonator structures may also be used.

The increasing interest in resonators related to qubit design has been caused by improvements in performance provided by coplanar waveguide (CPW) resonators described herein. In contrast to lumped element resonators which comprise lumped element capacitors and/or inductors coupled either in a parallel or a series geometry, CPW resonators simply comprise a stripline between two ground-planes. The energy stored in a resonator is determined by its resonance frequency f0 and the number of the stored photons n (E=nhf0). CPW resonators may thus be provided having a well defined resonance frequency characteristic as well as a well-defined coupled quality factor characteristic. The resonance frequency is controlled by the resonator length and its loaded quality factor is controlled by its capacitive coupling to input and output transmission lines. Strongly coupled (overcoupled) resonators with accordingly low quality factors are ideal for performing fast measurements of the state of a qubit integrated into the resonator. On the other hand, undercoupled resonators with large quality factors can be used to store photons in the cavity on a long time scale, with potential use as a quantum memory.

The coplanar waveguide resonator (CPW) 5 thus comprises a strip that may be meandered depending upon the length. The strip may be either shorted to ground ($\lambda/4$) or open ended ($\lambda/2$-resonator). The resonance frequency for such a resonator is determined by its length and the light velocity in the material. A series of CPW resonators with different frequencies can be measured by using a single feedline. In one embodiment, the resonator shorts to a ground plane at one end, and capacitively couples to a through line at another end. It is possible to combine airbridges and or crossovers and CPW capacitors to increase coherence. It is further possible to use Squid shunted with CPW. It is further possible to use capacitively coupled CPW.

Processing then continues by depositing a resonator thin film over the buffer layer (46). A photo resist layer is then patterned over the thin film layer (50) and the resonator thin film layer and/or buffer layer and/or substrate portions are etched (52). Either positive or negative resists may be used and either wet or dry etch techniques may be used. The resist is then removed and the thus formed resonator may then be cleaned.

In one example, photoresist can be provided as AZ1512 deposited by spin coating at 4000 RPM to create 1.2 micron thick resist. Resist baked at 105 degree Celsius for 2 minutes and exposed at round 60 mJ/cm². In one example, 2 minutes in MIF917 can develop the resonator feature. A 7 minute etch with CF4/O2 (15 sccm:1 sccm) at 10 mTorr at 250V (~38 W) is good for etching 50-70 nm TiN film. It is further possible to use $BCl_3/Cl_2$ based plasma etch for TiN. It is possible to use dry stripping of resist using $O_2/N_2/H_2O$ at around 150 degree Celsius at 2000 mtorr pressure. It is further possible to use single or multistep wet etching and or stripping. Act935 and or Hot acetone (40 C) and or Aleg380 can be used for etching as well as resist stripping process. It is further possible to use oxygen-helium and/or forming gas and/or atmospheric and/or argon and/or hydrogen-helium plasma to clean the residual organic from resonators.

Figure 3:
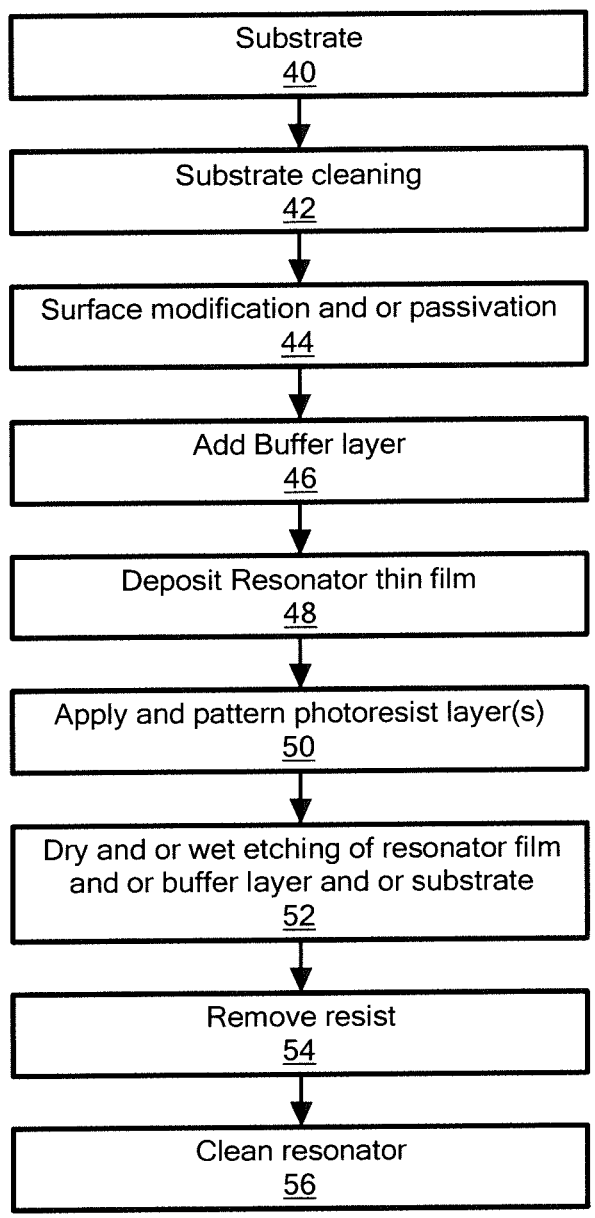
FIG. 3 is a flow diagram illustrating a process for fabricating a CPW resonator.
Figure 3A:
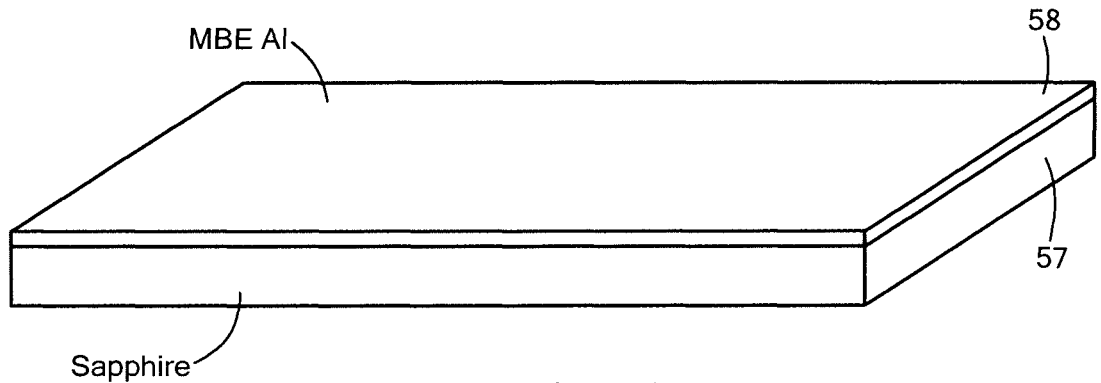
FIG. 3A is an isometric view of a sapphire substrate having a high Q metal disposed thereover.
Figure 3B:
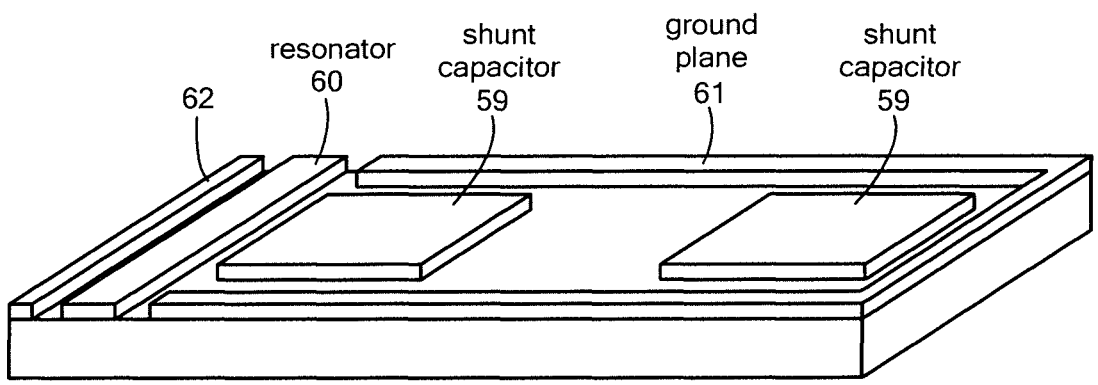
FIG. 3B is an isometric view of a sapphire substrate having an MBE aluminum patterned to provide a capacitor.
Figure 3C:
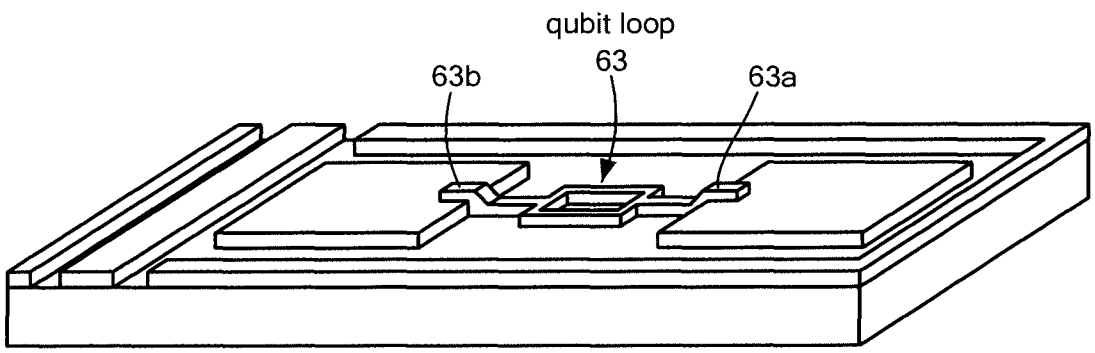
FIG. 3C is an isometric view of an aluminum qubit loop which contains three aluminum Josephson junctions.

In one particular process flow example and with reference to FIGS. 3A-3C in which like elements are provided having like reference designations, film 58 having a high Q characteristic (so-called "high-Q films") was deposited on 50-mm outgassed C-plane sapphire substrate 57 (e.g. a sapphire wafer). It should, of course, be appreciated that in alternate embodiments Si or other substrate materials may be used. The wafers were cleaned in piranha solution (sulfuric acid and hydrogen peroxide) prior to loading into the deposition system. The wafers were annealed in a deposition system at RT-900 C to facilitate outgassing and sapphire surface reconstruction, after which 250 nm of aluminum was deposited (e.g. using a molecular beam epitaxty (MBE) technique) at a growth rate of 0.025 nm/s and a substrate temperature of 150 C (FIG. 3A). Although aluminum was used in this particular example, it should be understood that other high Q materials may also be used.

As shown in FIG. 3B, the high-Q aluminum was patterned (e.g. using contact lithography techniques and wet-etching and/or dry etching techniques) or otherwise processed to provide device features including, but not limited to, shunt capacitors 59, coplanar waveguide (CPW) resonators 60, ground plane 61 surrounding the capacitors, and optical alignment marks 62. In this illustrative embodiment, capacitors 59 are shown having a square, shunt capacitor geometry. Those of ordinary skill in the art will appreciate, of course, that capacitors may be formed having a wide variety of different geometries selected to suit the needs of a particular application.

As shown in FIG. 3C, an aluminum qubit loop 63 is then patterned or otherwise provided such that first and second connection points 63a, 63b electrically contact the shunt capacitors 59. In this illustrative example, qubit loop 63 is provided having three Josephson junctions 64a, 64b, 64c with two Josephson junctions 64a, 64b disposed on one side on the loop 63 and a single Josephson junction 64c disposed on a second, opposite side of the loop.

A Josephson junction is defined as two superconductors allowed interacting through a so-called "weak link," where the "weak link" may be provided from a thin insulating barrier, a normal metal, or a narrow superconducting constriction—respectively referred to as an S—I—S, S—N—S, or S—C—S junction. A supercurrent flows/tunnels through this weak link, even in the absence of a voltage. The critical current of the junction is related to the superconducting gap of the electrode materials as well as the type and thickness of the insulating barrier. It is often characterized by a critical current density Jc and the area A of the junction such that Ic=Jc×A.

Josephson tunnel junctions are formed by two superconducting electrodes separated by a very thin (~1 nm) insulating barrier. In this configuration, the collective superconducting order of one electrode (parameterized by a phase $\varphi_1$) coherently connects with that of the other electrode ($\varphi_2$) via the elastic tunneling of Cooper pairs through the barrier. The resulting supercurrent, I, and junction voltage, V, are related to the superconducting phase difference, $\varphi=\varphi_1-\varphi_2$, across the junction In one illustrative embodiment, the qubit loop and Josephson junctions were formed using double-angle evaporation of aluminum through Dolan-style bridges. The free-standing bridges were realized using a bilayer mask comprising a germanium hard mask on top of a sacrificial MMA/MAA layer [MicroChem methyl methacrylate (MMA (8.5)/MAA EL9)]. The qubit loop and junctions were patterned using electron-beam lithography (Vistec EBPG5200) and ZEP520A resist (ZEON-REX Electronic Chemicals). This pattern was transferred into a Germanium (Ge) layer using a CF4 plasma, and the underlying MMA/MAA resist was under-etched using an oxygen plasma to create free-standing bridges. Prior to the aluminum evaporation, ion milling was used to clean exposed contact points on the MBE aluminum and or titanium nitride to ensure superconducting contact with the evaporated aluminum. In one embodiment qubit loop formed on top of resonator surface. The qubit loops and junctions were realized with two separate angle-evaporated aluminum layers (formed between the two aluminum evaporation steps), static oxidation conditions were used to prepare junctions having an appropriate critical current density. In one embodiment qubit loop is provided as a relatively large Al—$AlO_x$—Al junction having characteristics similar to a superconducting wire during device operation. It is further possible that at least part of the qubit loop can have junction oxide sandwiched between Al metal layers. Oxide can be partially and or fully separated Al loop metal layers. It is possible to use Poly methyl methacrylate and or acrylate based resist and or Poly butene-1-sulphone based resist instead of, ZEP. It is further possible to use epoxy copolymer of glycidyl methacrylate and ethyl acrylate based negative resist and or 3 components (base polymer, an acid generator, and a crosslinking agent) based negative resist can be used instead of ZEP.

The materials and techniques described herein enable fabrication of TiN superconducting CPW resonators having internal quality factors above $10^7$ at high powers and over $10^6$ at low power single photon regime from two different sputtering systems (Sigma and Endura systems). The materials and techniques described also result in cross-wafer reproducibility. That is, resonators made from two different tools (i.e. Sigma and Endura tools) showed consistency across wafers with low power Qi's over a million over the entire wafers. Furthermore, materials and techniques described herein result in wafer-to-wafer reproducibility. For example, both Sigma and Endura tool produces resonators from new wafers show low power Ws over a million. The materials and techniques described herein are also capable of depositing High Q TiN on an eight inch (8") wafer and are capable of generating high Q from various TiN film thickness. In one example, when Sigma tool used 6-12 kW deposition power, 150-450 degree Celsius deposition temperature, 15-33 sccm Ar flow, 90-100 sccm Nitrogen flow to produce very low stress in the range of 90-100 Mega pascale around 140-150 nm Titanium nitride with sheet resistance 3-25 ohms/square to produce best possible low power average Q in the range of 1-5 Million. It is further possible to use $Si_3N_4$ (SiN) buffer layer under the TiN. In one example, silicon nitride is a low-stress $Si_3N_4$. In another example, Endura can produce very high compressive stress and or tensile stress in the range of 0.5-4 giga pascale when deposited at around 200 degree Celsius produce around 65-75 nm titanium nitride with sheet resistance 9-30 ohms/square to produce best possible low power average Q in the range of 1-3 million. The intrinsic quality factor (Qi) of TiN resonators can vary by changing width and gap. Here gap may be defined as a spacing between the resonator center line and the ground plane; width may be defined as a width of the resonator center line. In one example, average low power Q from low stress TiN resonators from resonators with gaps/widths (gap is the spacing between the resonator center line and the ground plane; width is the width of the resonator center line) of 5 µm/10 µm, 8 µm/16 µm and 11 µm/22 µm respectively with single-photon Qi's over 1 million.

Referring now to FIGS. 4 and 4A in which like elements are provided having like reference numbers throughout the several views, a semiconductor structure 65 comprises a substrate 66 having a high Q metal 67 disposed over portions of a first surface thereof. Substrate 66 may be provided as a hydrogen and/or fluoride and/or nitride terminated substrate. Alternatively, substrate 66 may be provided having a native oxide layer. Substrate 66 may also be provided as a silicon ($S_i$) substrate having a high resistivity characteristic or as a high purity $S_i$ substrate or as an oxide coated silicon substrate. Substrate 66 may also be provided as a sapphire substrate. Preferred substrates are annealed, re-crystallized, and smooth (around 5 angstrom substrate roughness) so as to help to produce high quality film on the substrate surface. A layer of aluminum 66 is disposed over the first substrate surface and over the high Q metal portions 67. An aluminum junction 68 is formed using aluminum oxide (Al Ox; x=0.1-1.5).

Thus, the structure of FIGS. 4, 4A may be used as a building block or as a portion of a building block of a passive or active superconducting circuit. A Josephson junction 64 which may be the same as or similar to Josephson junctions 64a-64c described above in conjunction with FIG. 3C, is formed between the two regions of high Q material 67 (e.g. TiN) coupled by a superconducting trace 69. Prior to depositing superconducting trace 69, ion milling was used to clean exposed contact points on the 67 to ensure superconducting contact with the 69. It is further possible that the contact resistance between region 67 and superconducting trace 69 becomes superconducting during operation due to proximity. As will be described below in conjunction with FIGS. 7-7F variants of such a circuit structure may also be used.

Figure 5:
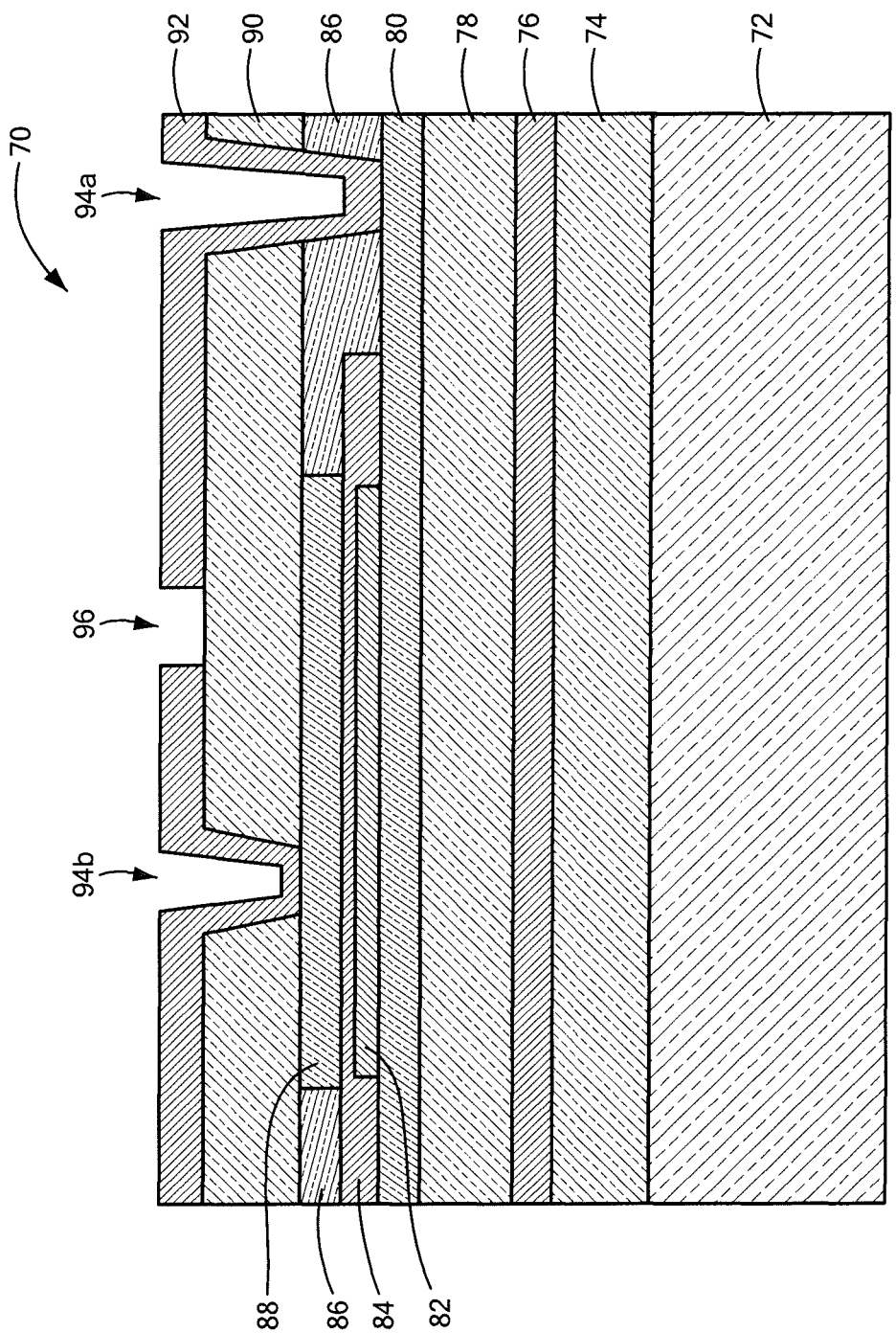
FIG. 5 is a cross-sectional view of a capacitor and a shunted nobium junction.

Referring now to FIG. 5, a super conducting IC 70 comprises a substrate 72 having an oxide layer 74 formed or otherwise disposed thereover. A high Q metal layer 76 is disposed over the oxide layer. A second oxide layer 78 is disposed over the high-Q metal layer 76. A niobium layer 80 is disposed over the second oxide layer 78.

An aluminum layer 82 is disposed over niobium or portions of nobium layer 80 and an aluminum oxide layer (AlOx) 84 is formed or otherwise disposed over aluminum layer 82 and portions of nobium layer 80.

A second nobium layer 88 is disposed over the AlOx (x=0.1-1.5) layer 84 so as to form a nobium junction. An anodized nobium oxide layer (NbOx) 86 is disposed over a AlOx layer 84 and portions of the nobium layer 80 so as to protect the nobium junction. A third oxide layer 90 disposed over the $NbO_x$ layer 86 and second nobium layer 88. A conductor 92 is disposed using either an additive technique (e.g. sputtering) or a subtractive technique (e.g. etching) and one or more conductive vias 94a, 94b may be formed or otherwise provided in the structure 70.

Openings 96 may also be formed or otherwise provided in conductive layer 92 (e.g. via an etching technique or via a masking and lift off technique). Conductive via 94a is formed or otherwise provided to contact the first nobium layer 80 while conductive via 94b is formed or otherwise provided to contact the second nobium layer. In one example, at least one of conductive via (94a, 94b) and/or conductive pad (92) and/or superconducting trace (76) include at least titanium nitride and or other high Q material.

A stack comprising layers of Nb/Al—AlOx-Nb can be used as a Josephson junction. Such a junction stack can be grown immediately after removal of native oxide from a bottom niobium electrode of the stack. A clean junction interface is desirable for realizing a robust and repeatable high-critical current junction. For this reason, it is sometimes preferable to first mill the sample to ensure that the surface is clean of native oxide inside the junction via. Next, a thin layer of aluminum is grown (about 8 nm) at low power. A thin aluminum layer won't uniformly cover the niobium, while a thick aluminum layer runs the risk of shorting out the junction by covering the via-step. Next, oxygen is introduced into the chamber to form the tunnel barrier. Initially, the chamber is seeded with a 1 mTorr oxygen flow for two minutes. The gate valve is then closed, allowing the oxygen pressure to rise to the target value. The sample is held in the oxygen atmosphere for 10 minutes, after which the oxygen is pumped out. A 4-12 nm cap of aluminum is deposited, directly followed by 100-200 nm nm of niobium.

The junction oxidation is the most variable part of a superconducting low-inductance undulatory galvanometer (SLUG) fabrication process. The critical current of the junctions is set, at least in part, by the oxidation exposure, which is the product of the oxygen partial pressure and the time. The critical current density (JC, critical current per junction area) scales inversely with the square root of exposure. It is possible that Nb-junction (Nb/Al—AlOx-Nb) may be fabricated on a silicon substrate with a 500 nm layer of thermal SiO$_2$. In one example, Josephson junctions are defined using 193 and or 248 nm optical lithography (stepper, 5× reduction) and subtractive dry etching of the Nb/Al—AlOx-Nb trilayer where AlOx dielectric layer sandwiched between a bottom superconductor material layer (Nb/Al) and a top superconductor material layer (Nb). It is further possible to use a thermal hardening process on the Josephson junction trilayer to control diffusion of the dielectric layer into the bottom superconductor material layer and the top superconductor material layer, and etching openings in the Josephson junction trilayer to form one or more Josephson junction qubits. In one embodiment, an AlOx dielectric layer may have etchant constituent predominately at the junction edge. Anodization of the lower Nb layer forms a thin NbOx protective layer around the junction. The inter-layer dielectric is a low-temperature PECVD silicon oxide deposit to embed the entire junction. The electrical connections between the lower and upper Nb wiring layers are formed using superconducting vias. Parallel-plate capacitors are formed implicitly where the upper and lower metallization layers overlap due to the intermediate PECVD and NbOx layers. An additional high-capacitance structure can be formed by creating a via from the upper metallization layer to the anodization layer. Electrical contact is made to the chip through titanium/platinum/gold bond pads. Anodizing Nb—Al—AlO$_x$ will result in Nb—NbO$_x$— AlO$_x$-NbO$_x$. It is possible to have NbO$_x$ presence in AlO$_x$ (x=0.1-1.5) layer and similarly it is also possible to present AlO$_x$ in the NbO$_x$ layer. Addition of oxide on anodized Nb—Al—AlO$_x$ layer will produce NbO$_x$— AlO$_x$-NbO$_x$—SiO$_x$. It is also possible to present Nb$_y$Si$_{(1-y)}$O$_x$ between NbO$_x$ and SiO$_x$ layer. Anodized produce porous niobium oxide and addition of PECVD oxide creates intermixing at the niobium oxide and PECVD oxide interface.

In yet another aspect of the concepts described herein, a method is provided of forming Josephson junction qubits. The method comprises depositing a first superconductor material layer (Nb—Al) over a substrate, forming a dielectric layer over the first superconductor material layer (Nb—Al—AlO$_x$), and depositing a second superconductor material layer(Nb) over the dielectric layer. The first superconductor material layer, the dielectric layer and the second superconductor material layer form a Josephson junction trilayer. It is further possible to use Al layer instead of Nb. The method further comprises annealing the Josephson junction trilayer in an inert environment at a temperature between about 150° C. to about 400° C. for a time period between about 10 minute to about 120 minutes to control diffusion of the dielectric layer into the first superconductor material layer and the second superconductor material layer. It is possible to use multiple etching. First etching will etch top superconductor and stop at oxide layer. Second etching step will etch oxide and bottom superconducting layer and thus etching Josephson junction trilayer of entire substrate form one or more Josephson junction qubits. It further possible that embedded Josephson junction qubits are arranged on a superconducting substrate and each qubits comprise a Josephson junction trilayer where a superconductor base layer of Josephson junction position on top of ground and large superconducting plane separated by thick (40 nm-400 nm) oxide dielectric. It is further possible to use one or more embedded Josephson junctions where a Josephson junction is sandwiched between a bottom superconductor material layer and a top superconductor material layer and the Josephson junction is separated from top and bottom superconducting layer by oxide dielectric. In some embodiments, at least one superconducting layer comprises of consists of titanium nitride.

Figure 6:
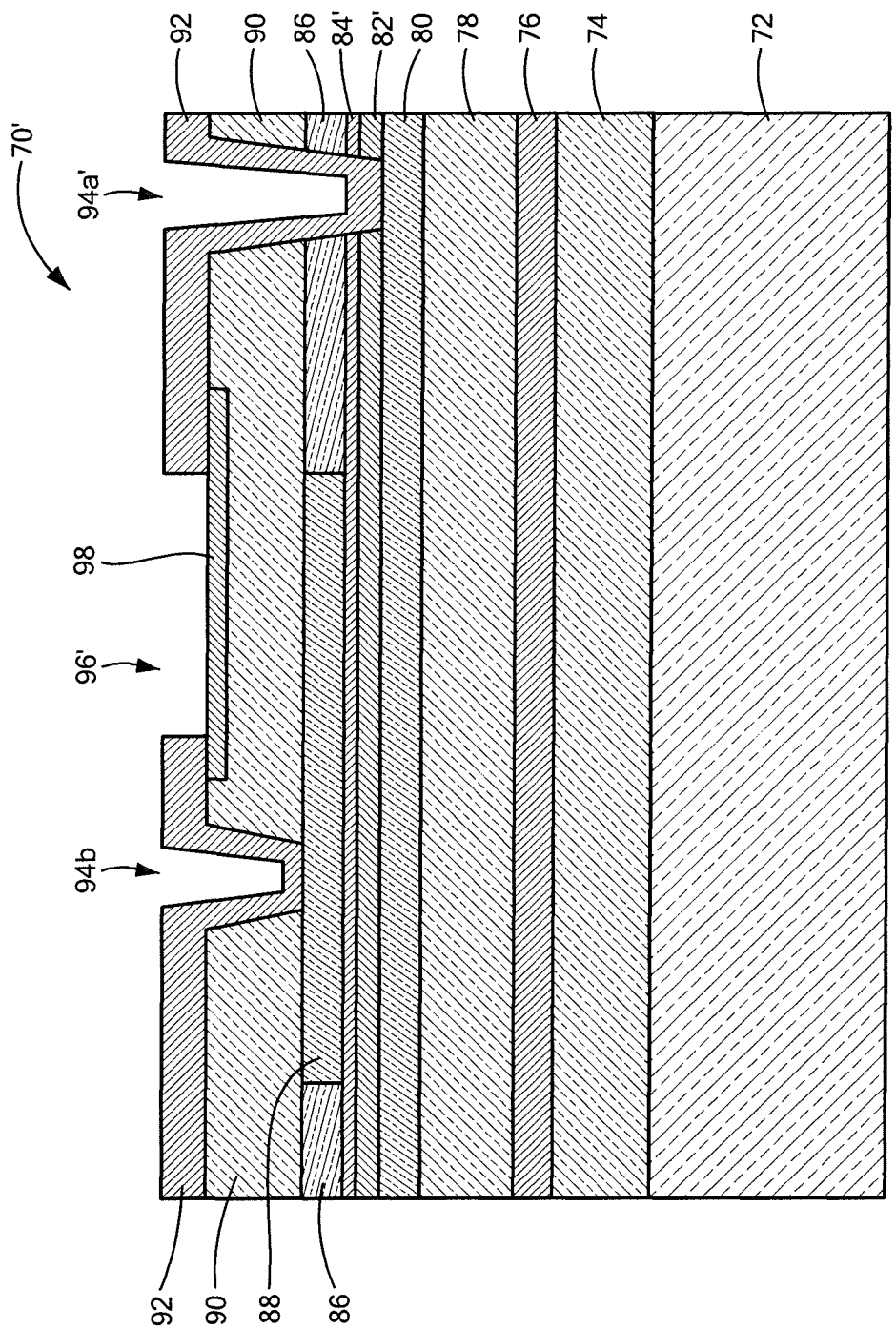
FIG. 6 is a cross-section view of a capacitor and a resistively shunted nobium junction.

Referring now to FIG. 6 in which like elements of FIG. 5 are provided having like reference designations, a superconducting IC 70' includes an aluminum layer 82' disposed over an entire portion of nobium layer 80 deposited on top of niobium layer 82 and an aluminum oxide layer 84' is disposed over an entire portion of aluminum layer 82'. The second nobium layer 88 are disposed over the AlOx layer 82' and selectively etched. Anodization of niobium layer 80 in presence of Al layer 80 and the AlOx layer 82' produce anodized niobium oxide layer 86. The PECVD oxide layer 90 is disposed over the NiOx and Nb layers 86, 88. In another example, anodization of niobium layer 80 and cross section of niobium layer 88 in presence of Al layer 80 and the AlOx layer 82' produce niobium oxide layer 86 which covers entire bottom niobium layer 80 and cross sectional area of top niobium layer 88.

In this illustrative embodiment, a conductive via 94a' is formed or otherwise provided through oxide layer 90, NbOx layer 86', AlOx layer 84', A1 layer 82' and contacts Nb contacts AlOx layer 88 as in FIG. 5.

In open region 96' a resistor 98 is formed or otherwise provided between the two conductive vias 94a', 94b. The resistor can be embedded in the oxide and connected with pad 92 by a superconducting micro-via. The via and micro-via can be filled, partially filled with single and or multilayer superconducting materials. In one example, a Nb/Al—AlO$_x$/Nb tri-layer utilizes 248-nm and 193-nm photolithography and planarization with chemical-mechanical polishing (CMP) for wiring-layer feature sizes down to 200 nm and Josephson junction diameters down to 250 nm. The process uses Nb superconducting layer, Pt or Mo based resistance layers and Nb and or TiN and or high Q metal based superconducting interconnects between all metal and resistor layers. Interconnects are etched and vias filled with the niobium metal and or titanium nitride and or high Q metal of the subsequent superconducting layer. The process uses superconducting circuits with a single and or multiple Josephson junction layer. Metal wiring layers are separated by dielectric, and vias are used to interconnect layers to form circuits. A separate resistive layer is deposited and patterned for shunt resistors. Chemical mechanical planarization (CMP) is employed at various steps in the process to maintain yield and uniformity. Superconducting integrated circuit requires under bump metal pad for flip chip bonding with SMCM. These pads are composed of 20 nm of Ti (adhesion layer), 50 nm of Pt (barrier layer) and 150 nm of Au.

It should be noted that like elements of FIGS. 5, 6 and 7-7F are provided having like reference numerals throughout the several views.

Turning now to FIG. 7, a circuit 100 which corresponds to a building block or part of a building block of a passive or active superconducting circuit includes a pair of Josephson junctions 102a, 102b disposed in separate legs 103a, 103b of superconducting traces 104 coupled between two regions 64 of high Q material (e.g. TiN). In one example, Josephson junctions 102a, 102b and superconducting traces 104, 103a, 103b are patterned using single photolithography process. In another example, 64 made with titanium nitride and superconducting traces 104, 103a, 103b use sputtered and or evaporated and or MBE aluminum. It is further possible, all the superconducting traces 64, 104, 103a, 103b use sputtered and or evaporated and or MBE aluminum.

Referring now to FIG. 7A, a plurality of Josephson junctions 102b, 102c are disposed in leg 103b provided by superconducting traces 104. A ground plane 106 is disposed about the Josephson junctions 102a-102c and a resonator 108 is formed or otherwise provided at one end of the structure 105 proximate one of the high Q metal regions 64. In one example, resonator 108, ground plane 106 and capacitor 64 are patterned using single photolithography process. In another example, 64, 106, 108 are made with titanium nitride and superconducting traces 104, 103a, 103b use sputtered and or evaporated and or MBE aluminum. It is further possible, all the superconducting traces 64, 106, 108, 104, 103a, 103b use sputtered and or evaporated and or MBE aluminum.

Referring now to FIG. 7B, resonators 108a, 108b are formed or otherwise provided at each end of structure 105'.

Referring now to FIG. 7C, a structure 110 corresponding to a building block or part of a building block of a passive or active superconducting circuit includes bias lines 112, 114. The bias lines 112, 114 may be provided as "on chip" or "off chip" bias lines. Using superconducting lines can reduce, and ideally eliminate, resistance and associated heat generation during circuit operation, thus improving qubit chip characteristics.

Figure 7D:
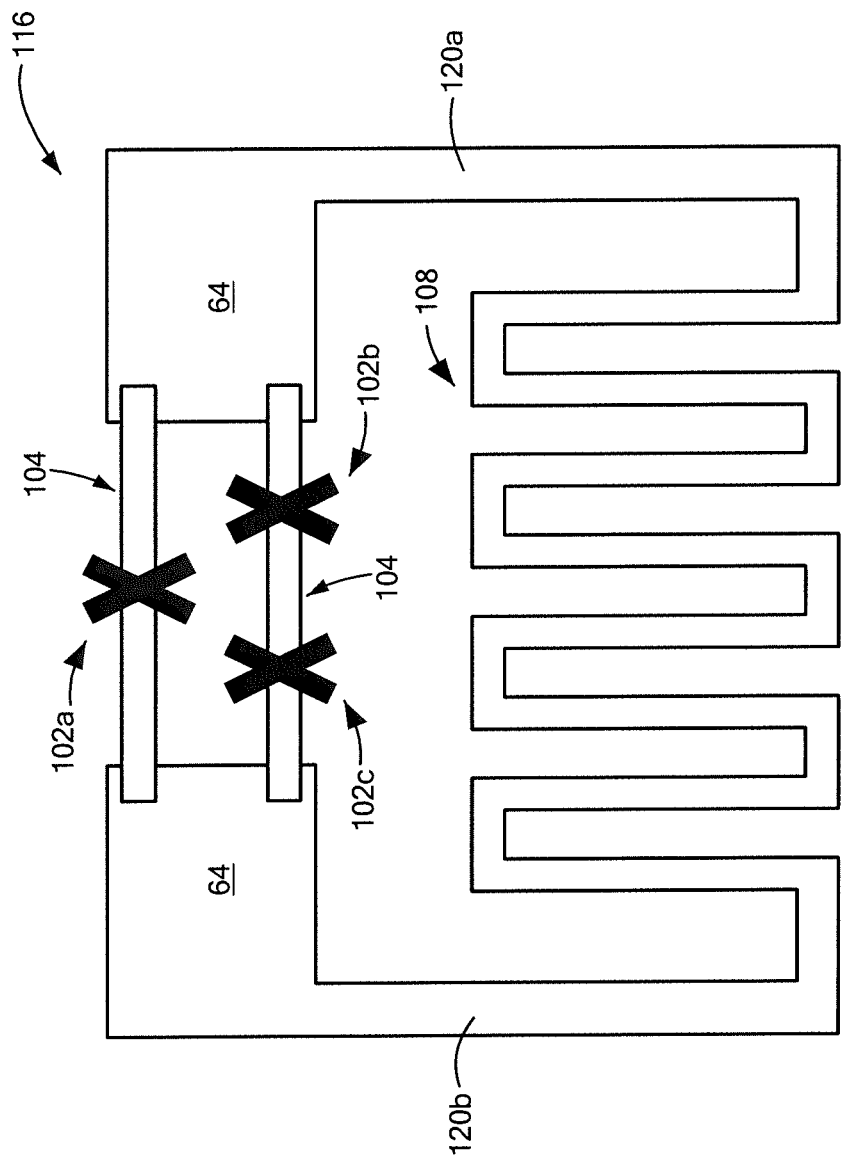
FIG. 7D is a plan view of a building block of a passive or active superconducting circuit having an inductor having a plurality of Josephson junctions.

Referring now to FIG. 7D, a structure 116 which may, for example, correspond to a building block or part of a building block of a passive or active superconducting circuit includes an inductive element 108 coupled between respective ends of paths 120a, 120b formed or otherwise provided from a high Q metal (e.g. TiN). Paths 120a, 120b extend between high Q metal regions 64 and inductive element 118 to provide a superconducting circuit having an inductive characteristic. In one example, inductive element 108 can use separate superconducting material (e.g. Niobium nitride) and a separate photolithographic process may be used to pattern the inductive element.

Figure 7E:
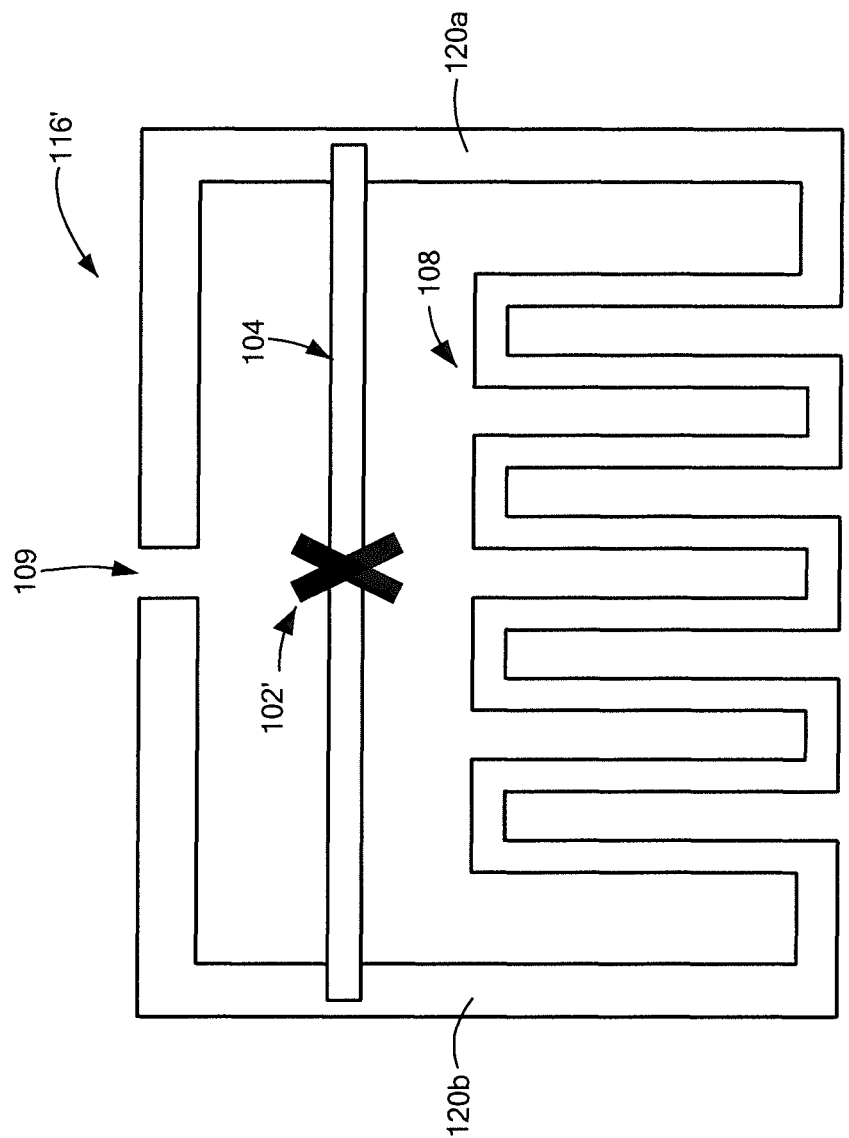
FIG. 7E is a plan view of a building block of a passive or active superconducting circuit having an inductor and a single Josephson junction.

Referring now to FIG. 7E a structure 116' which may, for example, correspond to a building block or a portion of a building block of a passive or active superconducting circuit includes an inductive element 108 and a capacitive element 109 each having first and second terminals coupled to respective ends of signal paths 120a, 120b. A single Josephson junction 102 is coupled between signal paths 120a, 120b provided from a high Q metal. Thus, a superconducting structure having capacitive and inductive characteristics is provided.

Figure 7F:
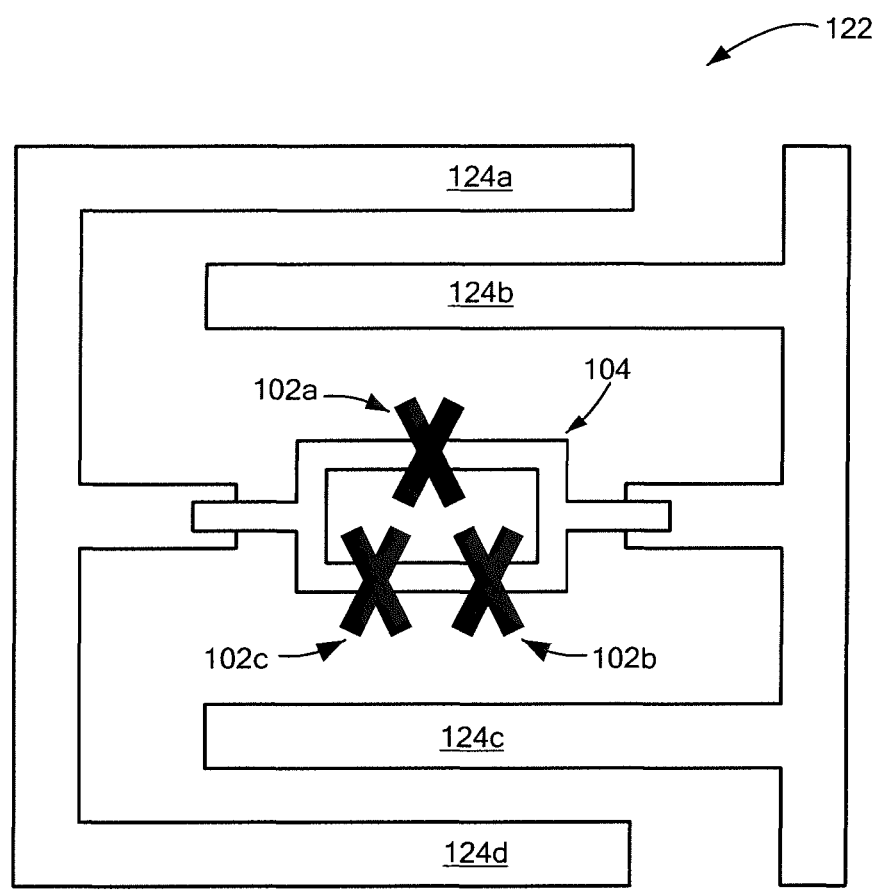
FIG. 7F is a plan view of a building block of a passive or active superconducting circuit having an inter digital capacitor.

Referring now to FIG. 7F, a structure 122 which may, for example, correspond to a building block of a passive or active superconducting circuit includes a plurality of inter digitated paths 124a-124d provided from a high Q metal material. First ones 124a, 124c of paths (or fingers) 124a-124d project from a first base structure 126 and second ones of paths 124b, 124d project from a second base structure 126b. The capacitance of the inter digital capacitor structure depends at least in part upon the finger base width, finger lengths, finger widths and number of fingers. FIG. 7-7F corresponds to a various building block or part of a building block of a passive or active superconducting circuit combinations. In one example, at least portion of FIG. 7-7F describe part of circuit for superconducting qubit coupled to a parallel or series LC oscillator, JJ coupled to parallel or series LC oscillator, Capacitively coupled qubits, Qubit coupled to electromagnetic resonator, Superconducting qubit coupled to coplanar waveguide resonator where the resonator is capacitively coupled to RF transmission lines, qubit is coupled via a capacitance etc. In another example, at least portion of FIG. 7-7F describe part of circuit for the amplifier to perform high-fidelity qubit readout.

Figure 9:
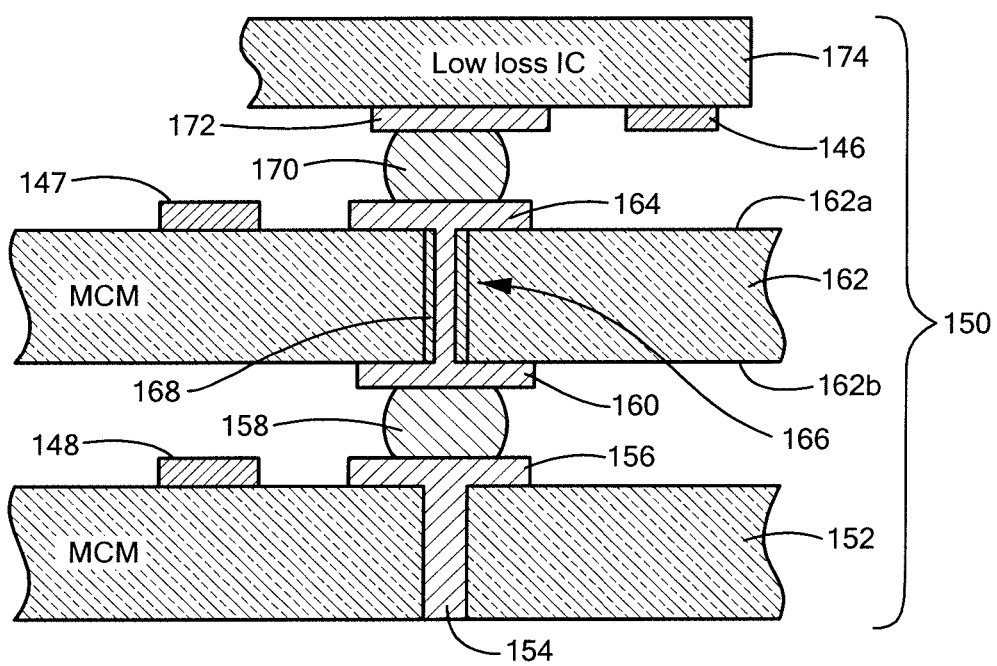
FIG. 9 is a low loss superconducting flip-chip structure having an intermediate substrate coupled between an MCM and a low loss integrated circuit.
Figure 9A:
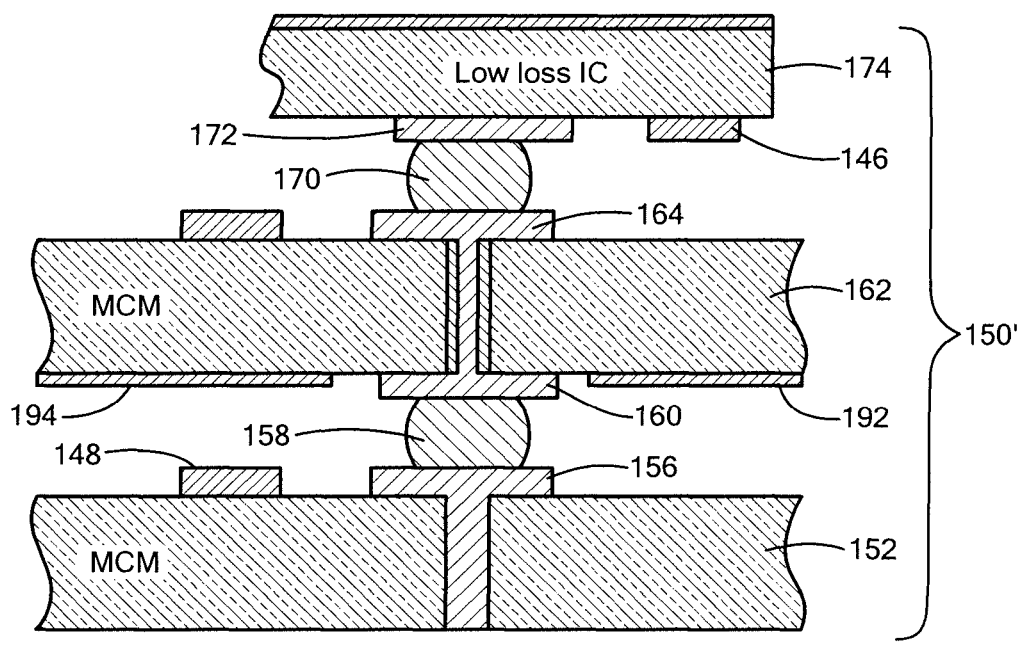
FIG. 9A is a low loss superconducting flip-chip structure having an intermediate substrate coupled between an MCM and a low loss integrated circuit and having a high Q metal shielding.

Described in conjunction with FIGS. 8-9A is an integrated approach to provide 3D constructions on various qubit die package configurations using a flip-chip superconducting interconnect technique. This approach is suitable for high-end electronics where part of a package, if necessary, can be replaced, repaired, or even upgraded without compromising overall electrical performance. Such replacement, repair or upgrade may be desirable for cost reasons, for example (e.g. it may be more cost effective to replace, repair or upgrade only a portion of the electronics rather than replace the entire electronics package). The interconnect methodology described herein may also be desirable for a range of superconducting applications since the techniques described herein make it possible to integrate non-superconducting and superconducting ICs. Thus, the interconnect methodology described herein facilitates integration of heterogeneous technologies and components on the same SoC platform.

Referring now to FIGS. 8 and 8A in which like elements are provided having like reference designations, a plurality of low loss superconducting integrated circuits (LLSICs) 130a-130d are coupled through respective ones of superconducting inter connects 132a-132p and respective ones of superconducting signal paths generally denoted 134 to a substrate 136. Superconducting interconnects may be provided from any suitable material including, but not limited to, those materials described above in connection with the definition of a superconducting interconnect. Substrate 136 may be provided, for example, as a superconducting multi-chip module (SMCM) substrate or as any suitable under bumpy metal (UBM) substrate. Substrate 136 may, in turn, be disposed over an optional second substrate (or carrier) 138. Signal paths 134 provide electrical signal path connections between desired ones of superconducting interconnects 132a-132p as well as between other circuit elements or components (now shown in FIG. 8 or 8A). Alternatively, 136 can be superconducting single-chip module (SSCM) or normal conductor based multi-chip module (MCM) or normal conductor based single-chip module (SCM)

In one example, substrate 136 electrically and/or capacitively and/or inductively is coupled to low loss superconducting integrated circuits (130a-130d). Superconducting inter connects 132a-132p can be produce by different methods. For example 4.8 micron tin and 5.2 micron Indium react at around 120-130 degree Celsius with each other to produce tin-indium solder. Similarly, 8 micron tin bump may react with 1 micron indium bump or pad, to produce a superconducting interconnect having a tin-indium interface and a tin-indium concentration gradient. It is further possible that an 8 micron indium bump may react with a 1 micron tin bump or pad, to produce a superconducting interconnect having tin-indium interface and tin-indium concentration gradient. When an 8 micron Pb bump reacts with a 1 micron tin bump or pad, it produces superconducting interconnect having tin-lead interface and tin-lead concentration gradient. When a Pb coated tin bump reacts with an indium pad, it produces an interconnect having PbSn at Pb interface and Sn—In at In pad interface, Sn concentration gradient and Sn bump. When a 4.8 micron gold coated tin bump reacts at elevated temperature (120-130 degree Celsius) with a 5.2 micron gold coated Indium bump, it produces tin-indium solder where gold coating is thin enough (<50 nm) to diffuse into the solder matrix. It is possible to use gold coating in all of the above interconnect compositions where a gold coating may be used to protect the metal from oxidation and thus allow reaction with each other during superconducting interconnect formation.

As may be more clearly visible in FIG. 8A, in some embodiments, a first superconducting trace 138 may optionally be disposed between a connection point of low loss IC 130a and a surface of superconducting interconnect 132a and a second superconducting trace 140 may optionally be disposed between a surface of superconducting interconnect 132a and signal path 140 and superconducting via 134. Thus, superconducting traces 138, 140 and superconducting interconnect 132 form a connection path between IC 130a and via 134. As noted above, in some embodiments superconducting traces 138, 140 may be omitted from the connection path. In one example superconducting via 134 includes at least titanium nitride and or other high Q material.

Referring now to FIG. 8B in which like elements of FIG. 8A are provided having like reference designations, a connection path between low loss IC 130a and signal path 140 includes first and second layers of under bump metals (UBM) 142, 144 (e.g. which may be provided as one or a combination of $T_i/P_t/A_u$) disposed between superconducting interconnect 132a and respective ones of superconducting traces 138, 140. In one example, UBMs 142, 144 include at least titanium nitride and or other high Q material as part of the metal stack.

In one illustrative embodiment, one or more of the low loss superconducting ICs 130a-130d and/or SMCM 136 may include at least one which may be the same as or similar to the resonators described above in superconducting resonator devices 146, 148 conjunction with FIGS. 1-7. Superconducting resonator devices 146, 148 may be formed with a low stress having X-ray radius curvature over 100 meters, polycrystalline preferably (200)—oriented trenched titanium nitride (TiN) layer deposited on an $S_i$ service having a high resistivity characteristic. This arrangement provides high Q, low loss resonator structures suitable for operation over RF and/or microwave frequency ranges.

Referring now to FIGS. 9, 9A in which like elements are provided having like reference designations, a low loss flip-chip superconducting structure 150 comprises a superconducting multi-chip module (SMCM) 152 having a super conducting via signal path 154 disposed therethrough (i.e. between first and second surfaces of SMCM 152). A first end of via 154 has a superconducting trace 156 disposed thereover and a superconducting interconnect 158 is disposed over trace 156. A second superconducting trace disposed on a bottom surface 162b of an intermediate substrate 162. Alternatively, 152 can be superconducting single-chip module (SSCM) or normal conductor based multi-chip module (MCM) or normal conductor based single-chip module (SCM)

A second superconducting trace 164 is disposed over a top surface of intermediate substrate 162. A superconducting via 166 is provided in substrate 162 and is electrically coupled between traces 160, 164. Superconducting via comprises a low stress Titanium Nitride (TiN) superconducting or non-superconducting layer 168. Thus, intermediate substrate 162 is provided having at least one through via (e.g. via 166) containing a low stress TiN superconducting or non-superconducting layer (e.g. such as layer 168).

In one embodiment, non-superconducting layer 168 may consist of or comprise single and/or multiple superconducting materials or multiple layers of single superconducting materials. It is further possible that at least one material and/or at least one composition in 168 is superconducting. It is further possible non-superconducting layer 168 may consist of or comprise normal and superconducting materials. It is also possible that non-superconducting layer 168 may consist of or comprise superconducting and/or non-superconducting titanium nitride composition. Non-superconducting layer 168 can be provided as a combination of titanium-titanium nitride-tungsten and/or titanium-titanium nitride-high Q materials-tungsten and or titanium-titanium nitride-high Q materials and or titanium-high Q materials-tungsten and or high Q materials-tungsten and or high Q materials, etc. . . .

A second superconducting interconnect element 170 is disposed over signal path 164 and is electrically coupled to a low loss IC 174 through a signal path 172. Thus, with this structure, one or more low loss ICs 174 may be electrically and physically coupled to a SMCM through an intermediate substrate with one or more superconducting interconnects.

In embodiments, some or all of low loss superconducting ICs, intermediate substrates and SMCMs may include one or more superconducting resonator devices. In the illustrative embodiment of FIG. 9, superconducting resonator devices 146-148 are disposed on respective ones of SMCM 152, intermediate substrate 162 and low-loss superconducting IC 174. Superconducting resonator devices may be the same as or similar to superconducting resonator devices described above in conjunction with FIGS. 1-5) formed with a low stress, X-ray radius of curvature over 100 meters, polycrystalline (preferably 200 oriented), trenched TiN layer deposited or otherwise provided on a high resistive $S_i$ surface to provide high Q, low-loss resonator structures preferably operated at RF and/or microwave frequencies (e.g. over the 100 MHz to 100 GHz frequency range). In one example, 146 and 147 can be resonator-to-feed-line coupling portion where 146 can be resonator portion and 147 can be feedline portion and capacitively coupled with each other. In another example, 146 and 147 each can have portion of device (qubit, resonator etc) and capacitively and or inductively and or electrically coupled with each other to complete the device. It is also possible at least portion of building blocks described in FIG. 7-7F can be distributed between 146 and 147 and capacitively and or inductively and or electrically coupled with each other. Structure 150 may also include one or more resonator structures 146, 147, 148 shown disposed on surfaces of respective ones of SMCM 152, intermediate substrate 162 and low loss IC 174. It should be noted that structure 150 may include only one, two or none of the resonator structures 146, 147, 148. It is possible that at least portion of building blocks described in FIG. 7-7F can be distributed between 146 and 147 and electrically coupled with each other using superconducting and or partially superconducting bump. It is further possible that at least portion of building blocks described in FIG. 7-7F can be distributed between 146, 147 and 148 and electrically coupled with each other using superconducting and or partially superconducting bump, and superconducting and or normal TSV.

Referring now to FIG. 9A, one or more low-loss ICs 174 coupled to an SMCM 152 through an intermediate substrate 162 with a superconducting interconnect includes shielding structures 190, 192, 194 coupled to the low-loss superconducting ICs 174 and/or intermediate substrate 162. Thus, at least portions of LLSIC's such as any of LLSICs 132a-132d (FIG. 8) may include high Q metal shielding and/or at least portions of intermediate substrate may include high Q metal shielding which shield components from spurious or undesirable electromagnetic energy or magnetic or infrared. In one example high Q metal act as a magnetic shield for the qubit. In general, high Q metal shielding is primarily magnetic shielding for qubits.

It should be appreciated that in some embodiments, conductive via 154 provided in SMCM 152 may be provided as a superconducting via which may be the same as or similar to via 166. Thus, both intermediate substrate 162 and SMCM 152 may be provided having one or a plurality of vias containing a superconducting layer (e.g. a low stress titanium nitride (TiN) superconducting layer). Alternatively, the intermediate and SMCM vias may be provided having non-superconducting layers.

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

It is to be appreciated that the concepts, systems, circuits and techniques sought to be protected herein are not limited to use in a particular application. In contrast, the concepts, systems, circuits and techniques sought to be protected herein may be found useful in substantially any application where a semiconductor manufacturer desires to fabricate superconducting circuits.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

A circuit quantum electrodynamics (circuit QED) may be used to address and measure a superconducting qubit. Circuit QED, superconducting qubits coupled to the electric field in a planar transmission line resonator. For cavity QED an atom in the cavity interacts with the trapped photons, and a measurement of the photons leaking out of the cavity allows one to probe the state of the atom.

In Circuit QED, the cavity is replaced by a $\lambda/2$ transmission line resonator that interacts with the outside world via two capacitors, Cin and Cout. A superconducting qubit sits at a voltage anti-node in the resonator, where the capacitance between the qubit and the resonator sets the interaction strength. Measurements may determine a maximum number of photons leaking out of the resonator (RFout) when the impinging signal (RFin) is on resonance with the resonator-qubit system.

For example, superconducting quantum interference device (SQUID) may be provided from a superconducting loop interrupted by two Josephson junctions. The net critical current of the SQUID can be tuned by threading a magnetic flux through the loop. SQUID is a tunable Josephson junction, and this feature is used to make "tunable" superconducting qubits, i.e., qubits with a parameter related to the junction Ic that is tunable by the magnetic field that threads the SQUID loop.

Accordingly, it is submitted that that scope of the patent should not be limited to the described embodiments but rather should be limited only by the spirit and scope of the following claims.

What is claimed is:

1. A superconducting integrated circuit, comprising:
   at least a portion of a superconducting resonator and/or qubit, including:
      a substrate having first and second opposing surfaces;
      a conductive layer having first and second opposing surfaces, wherein the first surface of the conductive layer is disposed over the second surface of the substrate, and the conductive layer includes at least one conductive material, the at least one conductive material including a substantially low stress polycrystalline titanium nitride (TiN) material having an internal stress below about two hundred fifty megapascal (MPa), such that the superconducting resonator and/or qubit is provided as a substantially high quality factor, low loss superconducting resonator and/or qubit;
   wherein the conductive layer is provided as a first conductive layer and the superconducting device further includes a second conductive layer having first and second opposing surfaces, wherein the first surface of the second conductive layer is disposed over the second surface of the first conductive layer, and the second conductive layer includes at least one physical superconducting, resistive, and/or tunneling contact extending from the first surface of the second conductive layer to at least a portion of the second surface of the second conductive layer and between the first and second surfaces of the first conductive layer.

2. The integrated circuit of claim 1 further includes a first dielectric layer having first and second opposing surfaces, wherein the first surface of the first dielectric layer is disposed over the second surface of the first conductive layer and the first surface of the second conductive layer is disposed over the second surface of the first dielectric layer, wherein the first conductive layer and the second conductive layer interconnect with at least one superconducting via, said at least one via including at least one substantially low stress; amorphous and/or polycrystalline high quality factor material.

3. The integrated circuit of claim 2 wherein the high quality factor material is a polycrystalline (200)-oriented titanium nitride (TiN) material and/or an amorphous TiN material.

4. The integrated circuit of claim 1 wherein the at least one conductive material additionally or alternatively includes a substantially high stress polycrystalline material having an internal stress between about four hundred megapascal (MPa) and about five gigapascal (GPa), wherein the high stress polycrystalline material is a (200)-oriented titanium nitride (TiN) material.

5. The integrated circuit of claim 1 wherein the conductive layer is annealed at a predetermined rate and temperature during and/or after fabrication of the conductive layer such that the at least one conductive material of the conductive layer changes from a first crystalline orientation and/or crystallinity form of the conductive material to a second, different form of the conductive material to increase the quality factor of the material as determined by at least one superconducting device.

6. The integrated circuit of claim 1, further comprising at least one of: a Josephson junction, an inductor, a capacitor, and a bias line.

7. The integrated circuit of claim 1 wherein the TiN material is a (200)-oriented polycrystalline.

8. The integrated circuit of claim 1 wherein the TiN material is provided as a (200) oriented single crystal material having a 4-fold symmetry and in-plane rotational alignment.

9. The integrated circuit of claim 1 wherein the substrate is provided from at least one of: silicon; deposited Silicon; silicon having at least one surface with a high resistivity characteristic; oxide coated silicon; oxide etched silicon; oxide etched annealed silicon; glass; aluminum oxide; sapphire; germanium; gallium arsenide; an alloy of silicon and germanium; and indium phosphide.

10. The integrated circuit of claim 1 wherein the second surface of the substrate is a saturated surface and/or an unsaturated surface having at least one of an oxide, hydroxyl, hydride, nitride, fluoride, silicon nitride, hydrogenated nitride, and a hydrogenated fluoride material disposed thereon.

11. The integrated circuit of claim 1 wherein the conductive layer of the superconducting device is electrically and/or mechanically interconnected with a respective conductive layer of a second integrated circuit using a superconducting bump and/or a partially superconducting bump.

12. The integrated circuit of claim 11 wherein the superconducting bump is disposed between a non-superconducting under bump metal (UBM) and a superconducting UBM, between a non-superconducting under bump metal (UBM) and a non-superconducting UBM, or between a superconducting under bump metal (UBM) and a superconducting UBM, said non-superconducting UBM and/or superconducting UBM including at least one conductive material, the at least one conductive material including a polycrystalline titanium nitride (TiN) material or another high quality factor material.

13. The integrated circuit of claim 12 wherein a low stress characteristic of the TiN material and/or the high stress characteristic of the TiN material provides for the superconducting device having an internal quality factor which is greater than about ten to the power of seven at substantially high excitation powers in photon energy regions of about ten to the power of six to about ten to the power of ten, and greater than about ten to the power of six at a substantially low power single photon regime.

14. A superconducting integrated circuit, comprising:
at least a portion of a superconducting resonator and/or qubit, including:
a substrate having first and second opposing surfaces;
a conductive layer having first and second opposing surfaces, wherein the first surface of the conductive layer is disposed over the second surface of the substrate, and the conductive layer includes at least one conductive material, the at least one conductive material including a substantially low stress polycrystalline titanium nitride (TiN) material having an internal stress below about two hundred fifty megapascal (MPa), such that the superconducting resonator and/or qubit is provided as a substantially high quality factor, low loss superconducting resonator and/or qubit; and
at least one qubit and/or superconducting quantum interference device (SQUID) with a portion of the cubit and or SQUID disposed on the second surface of the conductive layer.

* * * * *